US012628531B2

(12) United States Patent
Jang

(10) Patent No.: US 12,628,531 B2
(45) Date of Patent: May 12, 2026

(54) DISPLAY DEVICE

(71) Applicant: Samsung Display Co., Ltd., Yongin-si (KR)

(72) Inventor: Minsok Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 356 days.

(21) Appl. No.: 18/340,585

(22) Filed: Jun. 23, 2023

(65) Prior Publication Data

US 2024/0114752 A1     Apr. 4, 2024

(30) Foreign Application Priority Data

Sep. 30, 2022     (KR) ........................ 10-2022-0125775

(51) Int. Cl.
| *H10K 59/80* | (2023.01) |
| *G06F 1/16* | (2006.01) |
| *H04M 1/02* | (2006.01) |
| *H10K 102/00* | (2023.01) |

(52) U.S. Cl.
CPC ......... *H10K 59/873* (2023.02); *G06F 1/1616* (2013.01); *G06F 1/1656* (2013.01); *H04M 1/0216* (2013.01); *H10K 2102/311* (2023.02)

(58) Field of Classification Search
CPC ............ H10K 59/873; H10K 2102/311; G06F 1/1616; G06F 1/1656; H04M 1/0216
USPC ....................................................... 313/500
See application file for complete search history.

(56) References Cited

U.S. PATENT DOCUMENTS

| 10,042,394 B2 | 8/2018 | Myung et al. |
| 10,345,856 B2 | 7/2019 | Song |
| 11,348,488 B2 | 5/2022 | Jang |
| 2012/0161197 A1* | 6/2012 | Im .......................... B82Y 20/00 |
| | | 257/E33.064 |
| 2021/0118337 A1* | 4/2021 | Park ........................ G09F 9/301 |
| 2022/0147102 A1 | 5/2022 | Kishimoto et al. |
| 2022/0201879 A1 | 6/2022 | Kwak et al. |

FOREIGN PATENT DOCUMENTS

| KR | 10-2018-0062272 A | 6/2018 |
| KR | 10-2021-0126175 A | 10/2021 |
| KR | 10-2349301 B1 | 1/2022 |
| KR | 10-2022-0063796 A | 5/2022 |
| KR | 10-2022-0087193 A | 6/2022 |

OTHER PUBLICATIONS

K-PION: 10-2022-0125775; Transaction History (Year: 2022).*

* cited by examiner

*Primary Examiner* — James R Greece
*Assistant Examiner* — Hana S Featherly
(74) *Attorney, Agent, or Firm* — Womble Bond Dickinson (US) LLP

(57) ABSTRACT

A display device includes a display panel including a foldable area folded based on an axis extending in a first direction, and a first non-foldable area and a second non-foldable area spaced apart from each other in a second direction crossing the first direction with the foldable area being therebetween, and a support plate below the display panel, and including: a porous metal layer including a porous metal material, an upper support layer on the porous metal layer and having a different density from the porous metal layer, and a lower support layer below the porous metal layer and having a different density from the porous metal layer.

20 Claims, 15 Drawing Sheets

DISPLAY DEVICE

CROSS-REFERENCE TO RELATED APPLICATION

This application claims priority to and the benefit of Korean Patent Application No. 10-2022-0125775, filed on Sep. 30, 2022, in the Korean Intellectual Property Office, the disclosure of which is incorporated by reference herein in its entirety.

BACKGROUND

1. Field

Aspects of the present disclosure relate to a display device.

2. Description of the Related Art

Recently, mobile electronic devices have garnered widespread adoption. Laptop computers and tablet personal computers (PCs), in addition to small-sized electronic devices such as mobile phones, have been widely used as mobile electronic devices.

Such mobile electronic devices include display devices to provide various functions, for example, providing visual information such as images or video, to a user. Recently, a method of enlarging a display area of a display device while adding various functions to the display area is being studied.

Further, to decrease an overall size of an electronic device while increasing an area of a display area, a display device having a portion that is folded or rolled is being developed.

The above information disclosed in this Background section is only for enhancement of understanding of the background of the invention, and therefore it may contain information that does not form the prior art.

SUMMARY

Aspects of some embodiments of the present disclosure are directed to a display device in which impact resistance is enhanced (e.g., increased) by using a porous material for a support substrate disposed below a display panel.

Additional aspects will be set forth in part in the description which follows and, in part, will be apparent from the description, or may be learned by practice of the presented embodiments of the disclosure.

According to some embodiments of the present disclosure, there is provided a display device including: a display panel including a foldable area folded based on an axis extending in a first direction, and a first non-foldable area and a second non-foldable area spaced apart from each other in a second direction crossing the first direction with the foldable area being therebetween; and a support plate below the display panel, and including: a porous metal layer including a porous metal material; an upper support layer on the porous metal layer and having a different density from the porous metal layer; and a lower support layer below the porous metal layer and having a different density from the porous metal layer.

In some embodiments, the display device further includes an encapsulation material surrounding an edge of the support plate.

In some embodiments, the encapsulation material surrounds an edge of the porous metal layer.

In some embodiments, the encapsulation material includes a conductive spacer including a conductive material.

In some embodiments, a width of the porous metal layer in the second direction is smaller than a width of the upper support layer in the second direction and a width of the lower support layer in the second direction.

In some embodiments, the display device further includes an encapsulation material surrounding an edge of the support plate.

In some embodiments, the encapsulation material includes a portion protruding in a direction facing the porous metal layer.

In some embodiments, the porous metal layer includes at least one of porous aluminum, porous titanium, or porous copper.

In some embodiments, the upper support layer includes an opaque material.

In some embodiments, the upper support layer includes at least one of steel use stainless (SUS), titanium (Ti), Ti alloy, aluminum (Al), Al alloy, copper (Cu), Cu alloy, carbon fiber reinforced polymer (CFRP), or glass fiber reinforced polymer (GFRP).

According to some embodiments of the present disclosure, there is provided a display device including: a display panel including a foldable area folded based on an axis extending in a first direction, and a first non-foldable area and a second non-foldable area spaced apart from each other in a second direction crossing the first direction with the foldable area therebetween; and a support plate below the display panel, and including: a porous metal layer overlapping the foldable area and including a porous metal material; and a support layer surrounding at least a side surface of the porous metal layer.

In some embodiments, the support layer of the support plate includes a recess portion having a concave shape in a direction opposite to the display panel, in an area overlapping the foldable area.

In some embodiments, the porous metal layer is on the recess portion of the support layer.

In some embodiments, the support layer surrounds a side surface and a bottom surface of the porous metal layer.

In some embodiments, a top surface of the porous metal layer and a top surface of the support layer are on a same plane.

In some embodiments, the support layer of the support plate includes a first support layer and a second support layer spaced apart from each other in the second direction.

In some embodiments, the porous metal layer is on the first support layer and the second support layer.

In some embodiments, a top surface of the first support layer, a top surface of the second support layer, and a top surface of the porous metal layer are on a same plane.

In some embodiments, the porous metal layer includes at least one of porous aluminum, porous titanium, or porous copper.

In some embodiments, the support layer includes at least one of steel use stainless (SUS), titanium (Ti), Ti alloy, aluminum (Al), Al alloy, copper (Cu), Cu alloy, carbon fiber reinforced polymer (CFRP), or glass fiber reinforced polymer (GFRP).

BRIEF DESCRIPTION OF THE DRAWINGS

The above and other aspects, features, and advantages of certain embodiments of the disclosure will be more apparent from the following description taken in conjunction with the accompanying drawings, in which:

FIG. 7 is a schematic cross-sectional view of the display device taken along the line II-II' of FIG. 1A, according to some embodiments of the present disclosure;

FIG. 13 is a schematic cross-sectional view of the display device taken along the line III-III' of FIG. 1B, according to some embodiments of the present disclosure.

DETAILED DESCRIPTION

Figure 1A:
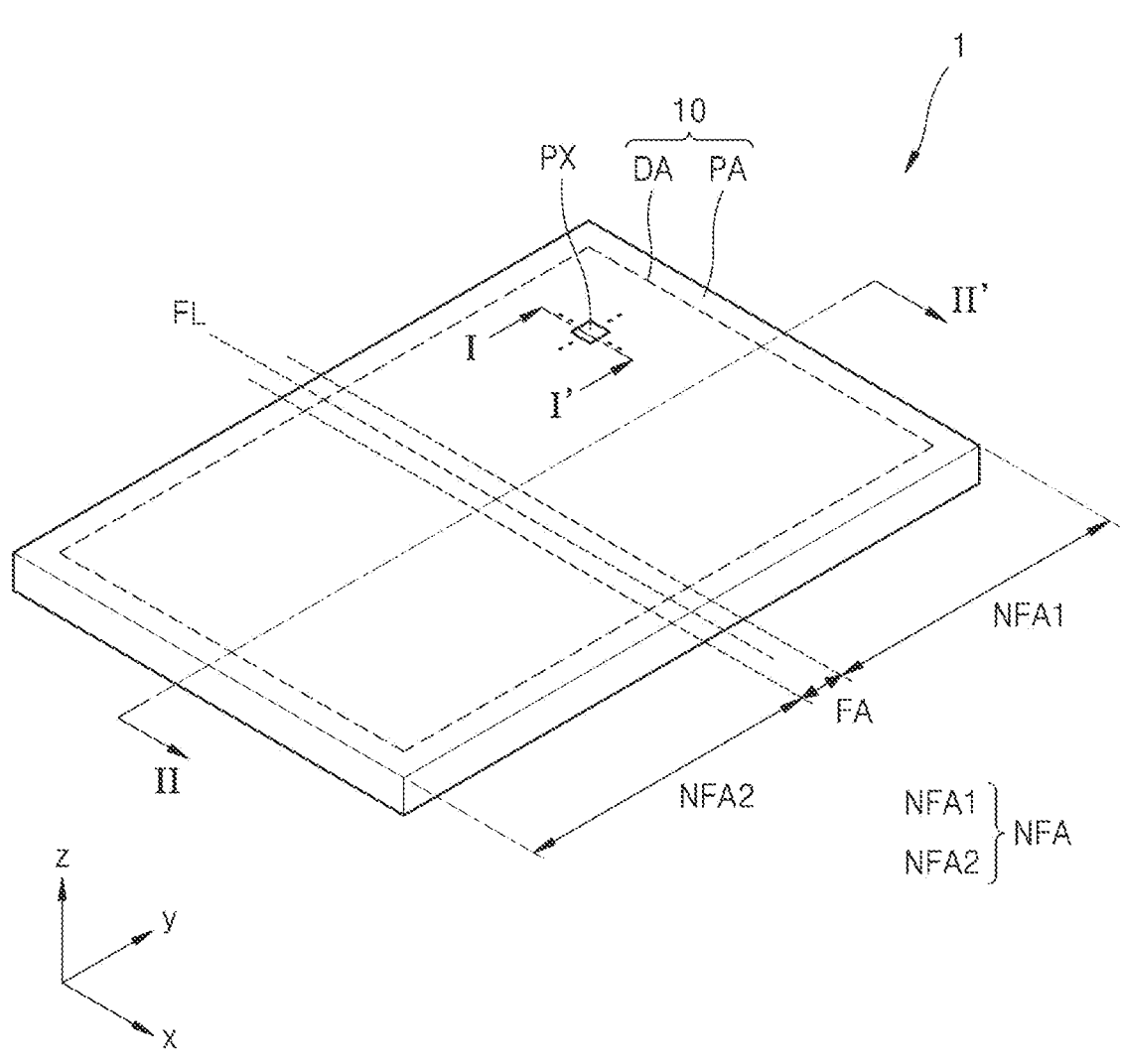
FIGS. 1A and 1B are schematic views of a display device before being folded, according to some embodiments of the present disclosure.

The disclosure may have various modifications and various embodiments, and specific embodiments are illustrated in the drawings and are described in detail in the detailed description. Effects and features of the disclosure and methods of achieving the same will become apparent with reference to embodiments described in detail with reference to the drawings. However, the disclosure is not limited to the embodiments described below, and may be implemented in various forms.

One or more embodiments will be described below in more detail with reference to the accompanying drawings. Those components that are the same or are in correspondence with each other are rendered the same reference numeral regardless of the figure number, and redundant explanations are omitted.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

In the following embodiments, the terms "first" and "second" are not used in a limited sense and are used to distinguish one component from another component.

In the following embodiments, an expression used in the singular encompasses the expression of the plural, unless it has a clearly different meaning in the context.

It will be further understood that the terms "include" and/or "comprise" used herein specify the presence of stated features or elements, but do not preclude the presence or addition of one or more other features or elements.

When a layer, region, component, or the like is connected to another layer, region, component, or the like, the layer, the region, the component, or the like may be not only directly connected thereto, but also indirectly connected thereto with an intervening layer, region, component, or the like therebetween. For example, in the specification, when a layer, region, component, or the like is electrically connected to another layer, region, component, or the like, the layer, region, component, or the like may be nor only directly electrically connected thereto, but also indirectly electrically connected thereto with an intervening layer, region, component, or the like therebetween.

It will be understood that when a layer, region, or element is referred to as being "formed on" another layer, area, or element, it can be directly or indirectly formed on the other layer, region, or element. That is, for example, intervening layers, regions, or elements may be present.

In the drawings, for convenience of description, sizes of components may be exaggerated or reduced. In other words, because sizes and thicknesses of components in the drawings are arbitrarily illustrated for convenience of explanation, the disclosure is not necessarily limited thereto.

When a certain embodiment may be implemented differently, a specific process order may be performed differently from the described order. For example, two consecutively described processes may be performed substantially at the same time or performed in an order opposite to the described order.

Figure 1B:
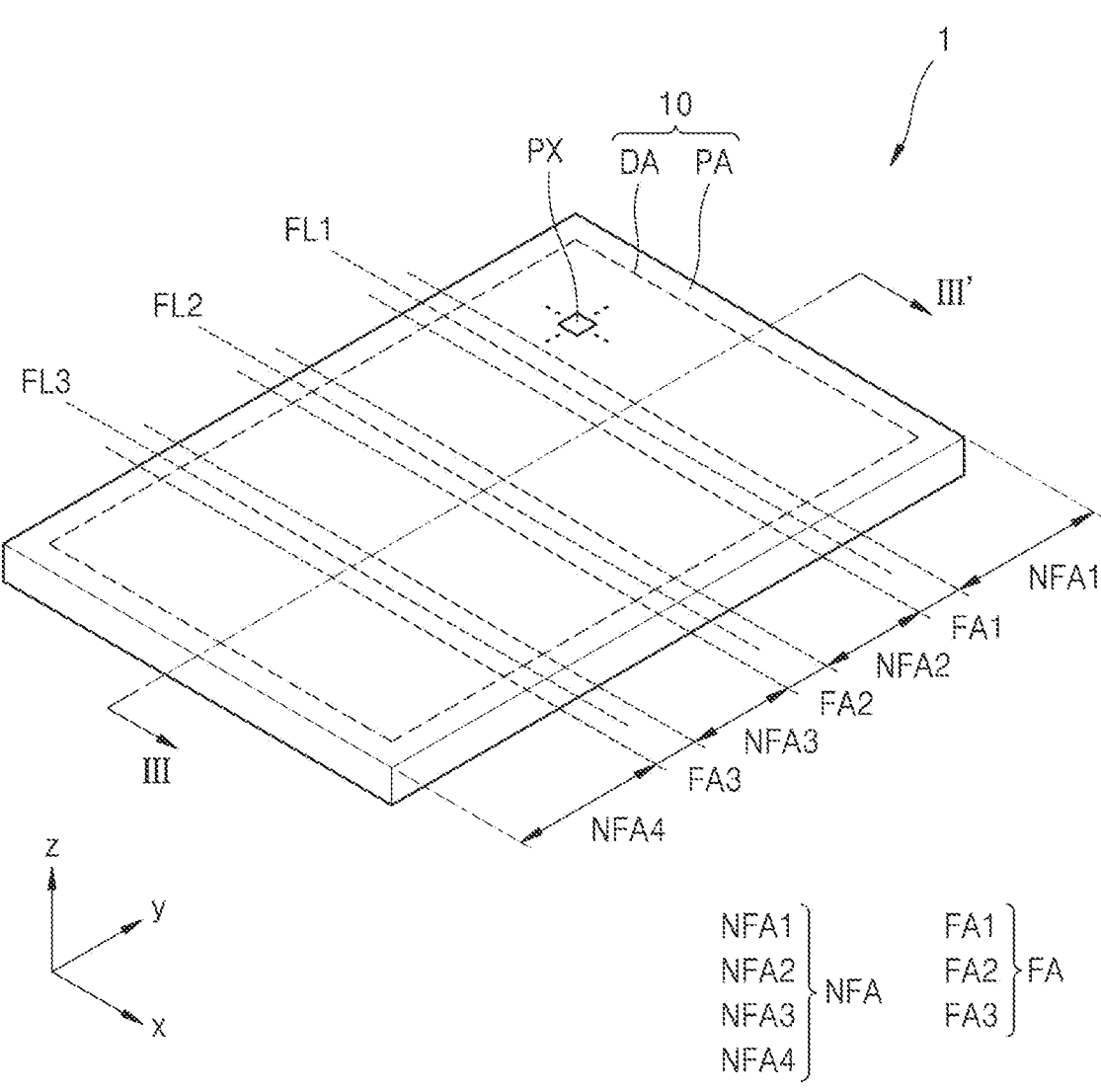
Figure 2A:
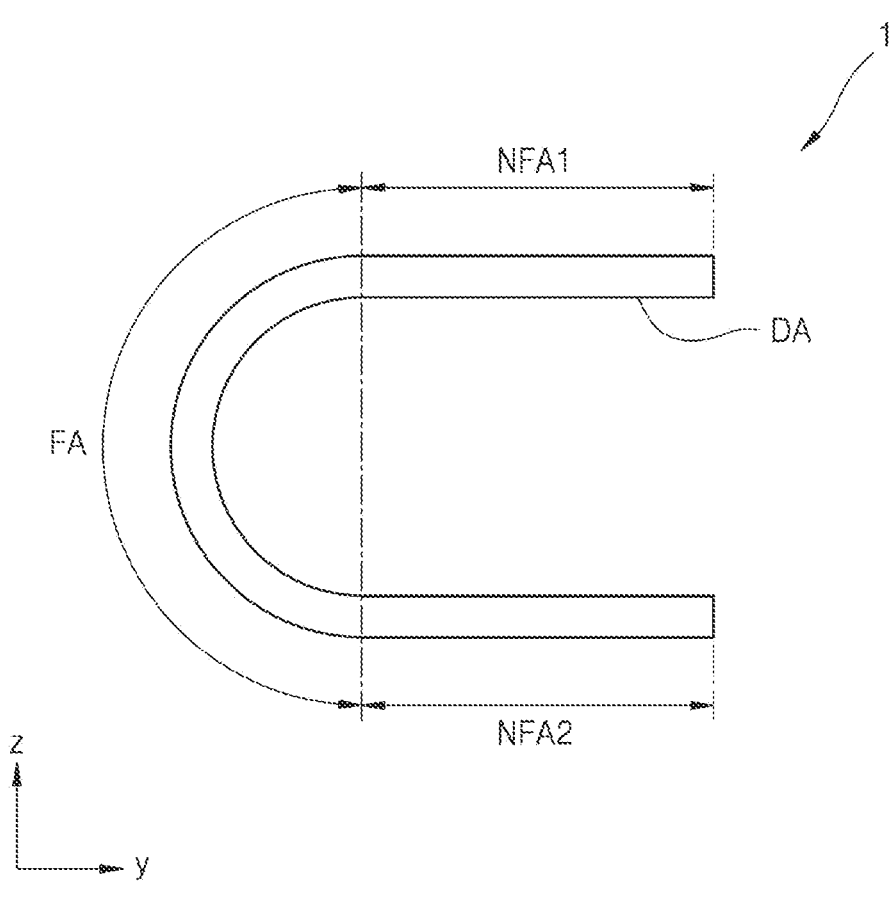
FIGS. 2A and 2B are schematic views of a display device in a folded state, according to some embodiments of the present disclosure.
Figure 2B:
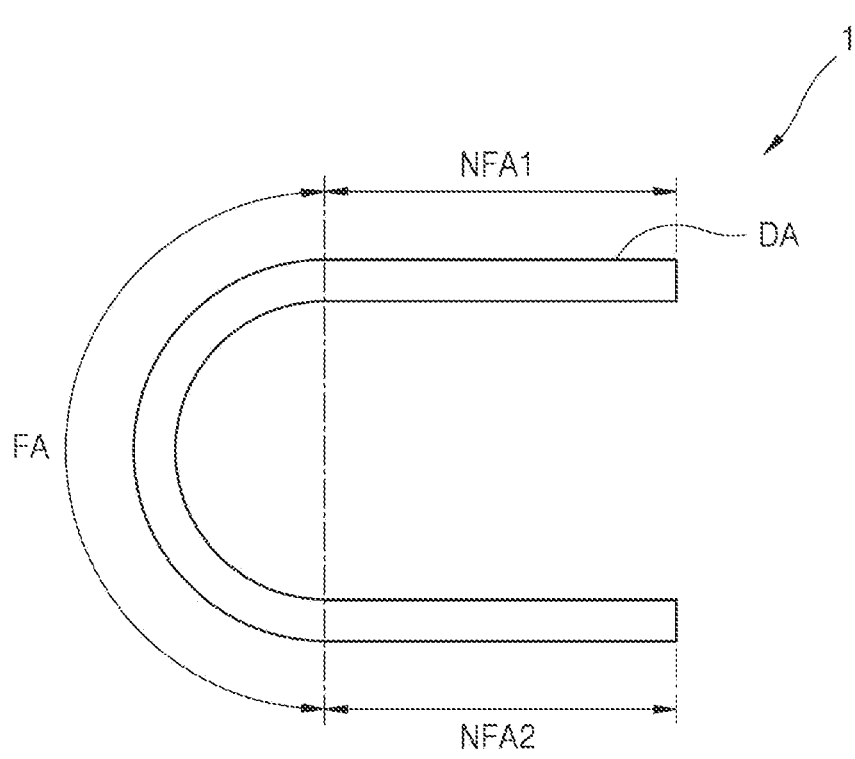

FIGS. 1A and 1B are each a schematic view of a display device 1 before being folded, according to some embodiments of the present disclosure. FIGS. 2A and 2B are cross-sectional views of the display device 1 in a folded state, according to some embodiments of the present disclosure.

A display device according to some embodiments may be a foldable or bendable display device. The display device may be provided in any one of various shapes, for example, in a rectangular plate shape having two pairs of parallel sides. When the display device is provided in the rectangular plate shape, one pair of sides may be longer than the other pair of sides. For convenience of description, the display device is illustrated in a rectangular shape having one pair of long sides and one pair of short sides, according to some embodiments, wherein an extension direction of the short sides is a first direction (i.e., the x-axis direction), an extension direction of the long sides is a second direction (i.e., the y-axis direction), and a direction perpendicular to the extension directions of the short sides and the long sides is a third direction (i.e., the z-axis direction).

A shape of the display device according to some embodiments of the present disclosure is not limited thereto, and may suitably vary. For example, the display device may be provided in any one of various shapes, such as a closed polygon including straight sides, a circle or oval including curved sides, and a semicircle or semioval including straight and curved sides. According to some embodiments, when the display device includes straight sides, at least some of the corners of a generally angular shape may be curved. For example, when the display device has a rectangular shape, a portion where adjacent straight sides meet may be replaced by a curve having certain curvature. In other words, a vertex of the rectangular shape may include a curved side having certain curvature and connected to two adjacent straight sides having both ends adjacent to each other. Here, the curvature may vary depending on its location. For example, the curvature may vary depending on the location where a curve starts and a length of the curve.

Referring to FIGS. 1A, 1B, 2A, and 2B, the display device 1 may include a display panel 10. The display panel 10 may include a display area DA and a peripheral area PA located outside the display area DA. The display area DA is an area where a plurality of pixels PX are arranged to display an image. The peripheral area PA is a non-display area that surrounds the display area DA and where pixels are not arranged (e.g., where pixels do not exist).

Various electronic devices or a printed circuit board may be electrically attached to the peripheral area PA, and a voltage line supplying power for driving a display element may be located in the peripheral area PA. For example, a scan driver providing a scan signal to each pixel PX, a data driver providing a data signal to each pixel PX, supply lines (a clock signal line, a carry signal line, and a driving voltage line) of signals input to the scan driver and data driver, and a main power line may be arranged in the peripheral area PA.

At least a portion of the display panel 10 may be flexible, and the display panel 10 may be folded at the flexible portion. In other words, the display panel 10 may include a foldable area FA that is flexible and foldable, and a non-foldable area NFA that is provided at least one side of the foldable area FA and is not foldable. Here, in some embodiments, an area that is not foldable is referred to as a non-foldable area, but this is only for convenience of description, and the expression "non-foldable" includes not only a case where an area is hard (e.g., rigid) without flexibility, but also a case where an area has flexibility that is less than that of the foldable area FA and a case where an area has flexibility but is not folded. The display panel 10 may display an image on the display area DA of the foldable area FA and non-foldable area NFA.

In FIG. 1A, for convenience of description, a first non-foldable area NFA1 and a second non-foldable area NFA2 have similar areas, and the foldable area FA is provided between the first non-foldable area NFA1 and the second non-foldable area NFA2; however, embodiments of the present disclosure are not limited thereto. For example, the first non-foldable area NFA1 and the second non-foldable area NFA2 may have different sized areas.

Also, as shown in FIG. 1B, there may be one or more foldable areas FA. In this case, a plurality of non-foldable areas, that is, the first non-foldable area NFA1, the second non-foldable area NFA2, a third non-foldable area NFA3, and a fourth non-foldable area NFA4 may be provided between respective ones of a first foldable area FA1, a second foldable area FA2, and a third foldable area FA3 to be separated from each other. In FIG. 1B, for example, the display panel 10 includes four non-foldable areas, that is, the first non-foldable area NFA1, the second non-foldable area NFA2, the third non-foldable area NFA3, and the fourth non-foldable area NFA4, and the first foldable area FA1, the second foldable area FA2, and the third foldable area FA3 are provided between the first non-foldable area NFA1, the second non-foldable area NFA2, the third non-foldable area NFA3, and the fourth non-foldable area NFA4; however, embodiments of the present disclosure are not limited thereto. In other words, the number of non-foldable areas NFA and the number of foldable areas FA may vary depending on some embodiments.

The foldable area FA, the first foldable area FA1, the second foldable area FA2, and the third foldable area FA3 may be respectively folded based on a foldable line FL, a first foldable line FL1, a second foldable line FL2, and a third foldable line FL3, which are axes extending in a first direction (x-axis direction). There may be a plurality of foldable lines, such as the foldable line FL, the first foldable line FL1, the second foldable line FL2, and the third foldable line FL3. The foldable line FL, the first foldable line FL1, the second foldable line FL2, and the third foldable line FL3 are respectively provided in the foldable area FA, the first foldable area FA1, the second foldable area FA2, and the third foldable area FA3 in a second direction (y-axis direction) that is an extension direction of the foldable area FA, the first foldable area FA1, the second foldable area FA2, and the third foldable area FA3. Accordingly, the display panel 10 may be folded in the foldable area FA, the first foldable area FA1, the second foldable area FA2, and the third foldable area FA3. The first non-foldable area NFA1, the second non-foldable area NFA2, the third non-foldable area NFA3, and the fourth non-foldable area NFA4 may be spaced apart from each other in the second direction (y-axis direction) crossing the first direction (x-axis direction), with the foldable area FA, the first foldable area FA1, the second foldable area FA2, and the third foldable area FA3 therebetween. As shown in FIG. 1A, the non-foldable area NFA may include the first non-foldable area NFA1 and the second non-foldable area NFA2 spaced apart from each other in the second direction (y-axis direction) with the foldable area FA therebetween. As shown in FIG. 1B, the non-foldable area NFA may include the first non-foldable area NFA1, the second non-foldable area NFA2, the third non-foldable area NFA3, and the fourth non-foldable area NFA4 spaced apart from each other in the second direction (y-axis direction) with the first foldable area FA1, the second foldable area FA2, and the third foldable area FA3 therebetween.

In FIGS. 1A and 1B, the foldable line FL, the first foldable line FL1, the second foldable line FL2, and the third foldable line FL3 respectively cross centers of the foldable area FA, the first foldable area FA1, the second foldable area FA2, and the third foldable area FA3. The foldable area FA, the first foldable area FA1, the second foldable area FA2, and the third foldable area FA3 are respectively axisymmetric based on the foldable line FL, the first foldable line FL1, the second foldable line FL2, and the third foldable line FL3; however, embodiments of the present disclosure are not limited thereto. In other words, the foldable line FL, the first foldable line FL1, the second foldable line FL2, and the third foldable line FL3 may be asymmetric in the foldable area FA, the first foldable area FA1, the second foldable area FA2, and the third foldable area FA3. The foldable area FA, the first foldable area FA1, the second foldable area FA2, and the third foldable area FA3 and the foldable line FL, the first foldable line FL1, the second foldable line FL2, and the third foldable line FL3 may overlap an area of the display panel 10 where an image is displayed, and when the display panel 10 is folded, the area where an image is displayed may be folded.

According to other embodiments, all of the display panel 10 may correspond to a foldable area. For example, when the display device 1 is rolled like a scroll, all of the display panel 10 may correspond to a foldable area.

As shown in FIGS. 1A and 1B, the display panel 10 may be unfolded flat as a whole. According to some embodiments, as shown in FIG. 2A, the display panel 10 may be folded such that the display area DA face each other based on the foldable line FL. According to other embodiments, as shown in FIG. 2B, the display panel 10 may be folded such that the display area DA faces outward, based on the foldable line FL. Here, the term "fold" denotes that a shape is not fixed but may be changed from an original shape to another shape, and includes a shape being folded along one or more specific lines, that is, the foldable line FL, curved, or rolled like a scroll. Accordingly, in some embodiments, surfaces of two non-foldable areas, that is, the first non-foldable area NFA1 and the second non-foldable area NFA2, are parallel to each other folded to face each other; however, embodiments of the present disclosure are not limited thereto, and the surfaces of the two non-foldable areas, that is, the first non-foldable area NFA1 and the second non-foldable area NFA2, may be folded at a certain angle (for example, an acute angle, a right angle, or an obtuse angle) with the foldable area FA therebetween.

Figure 3:
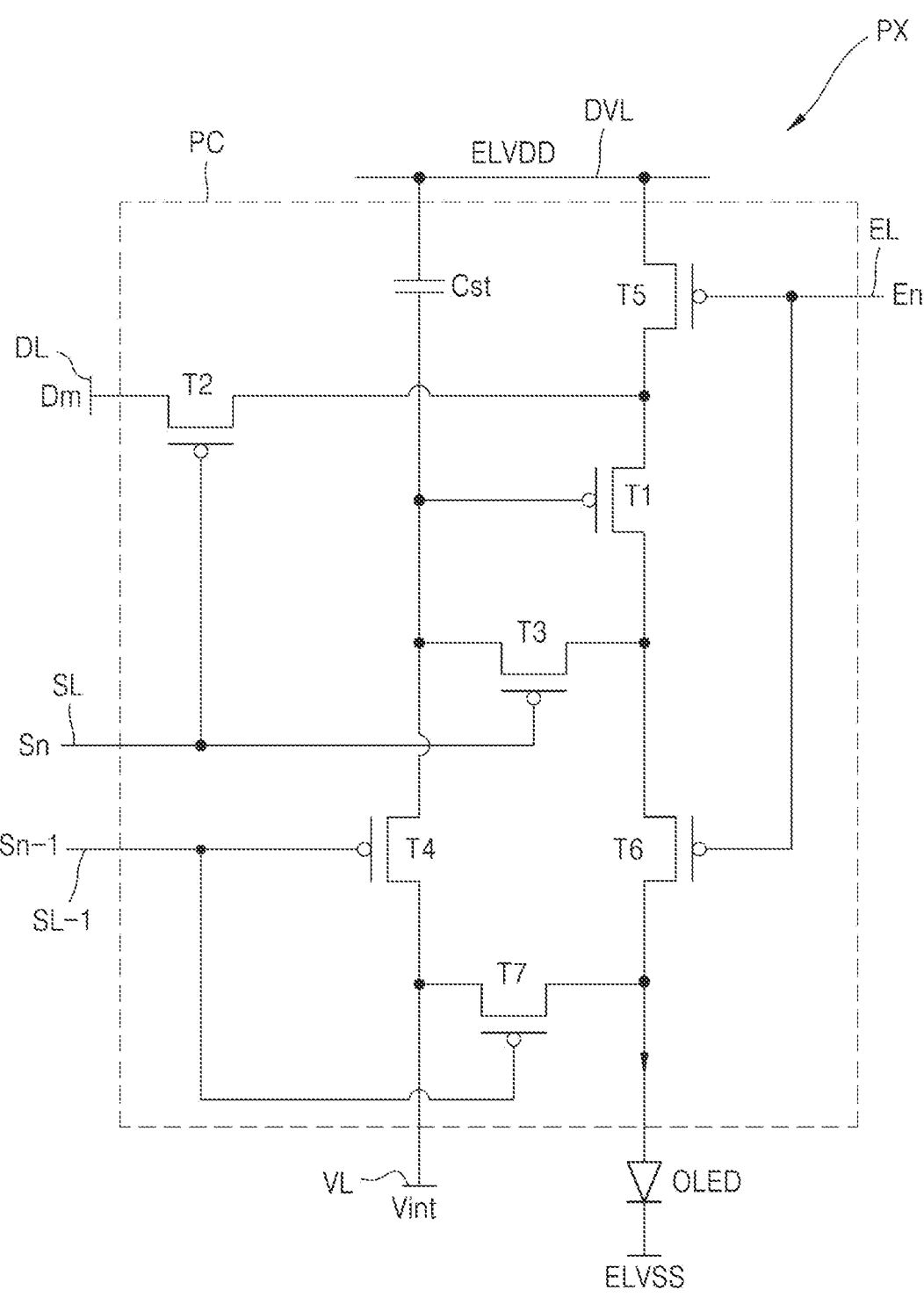
FIG. 3 is an equivalent circuit diagram of a pixel circuit included in a display device, according to some embodiments of the present disclosure.

FIG. 3 is an equivalent circuit diagram of a pixel circuit PC included in the display device 1 of FIGS. 1A and 1B, according to some embodiments of the present disclosure. In particular, FIG. 3 is an equivalent circuit diagram of the pixel circuit PC electrically connected to an organic light-emitting diode OLED forming some pixels PX included in the display device 1 of FIGS. 1A and 1B.

Referring to FIG. 3, the pixel circuit PC may include a driving thin-film transistor T1 and a plurality of switching thin-film transistors. The switching thin-film transistors may include a data write thin-film transistor T2, a compensation thin-film transistor T3, a first initialization thin-film transistor T4, an operation control thin-film transistor T5, an emission control thin-film transistor T6, and a second initialization thin-film transistor T7.

In FIG. 3, each pixel circuit PC includes a scan line SL, a previous scan line SL-1, an emission control line EL, a data line DL, an initialization voltage line VL, and a driving voltage line DVL; but according to other embodiments, at least one of the scan line SL, the previous scan line SL-1, the emission control line EL, the data line DL, and the initialization voltage line VL and/or the initialization voltage line VL may be shared between neighboring pixel circuits PC.

A drain electrode of the driving thin-film transistor T1 may be electrically connected to the organic light-emitting diode OLED through the emission control thin-film transistor T6. The driving thin-film transistor T1 may receive a data signal Dm according to a switching operation of the data write thin-film transistor T2, and supply a driving current to the organic light-emitting diode OLED.

A gate electrode of the data write thin-film transistor T2 may be connected to the scan line SL and a source electrode thereof may be connected to the data line DL. A drain electrode of the data write thin-film transistor T2 may be connected to a source electrode of the driving thin-film transistor T1 while being connected to the driving voltage line DVL through the operation control thin-film transistor T5.

The data write thin-film transistor T2 may be turned on according to a scan signal Sn received through the scan line SL to perform the switching operation of transmitting the data signal Dm transmitted to the data line DL, to the source electrode of the driving thin-film transistor T1.

A gate electrode of the compensation thin-film transistor T3 may be connected to the scan line SL. A source electrode of the compensation thin-film transistor T3 may be connected to the drain electrode of the driving thin-film transistor T1, and may be connected to a pixel electrode of the organic light-emitting diode OLED through the emission control thin-film transistor T6. A drain electrode of the compensation thin-film transistor T3 may be connected to one electrode of a storage capacitor Cst, a source electrode of the first initialization thin-film transistor T4, and the gate electrode of the driving thin-film transistor T1. The compensation thin-film transistor T3 is turned on according to the scan signal Sn received through the scan line SL, thereby connecting the gate electrode and the drain electrode of the driving thin-film transistor T1 to each other for diode-connecting the driving thin-film transistor Ti.

A gate electrode of the first initialization thin-film transistor T4 may be connected to the previous scan line SL-1. A drain electrode of the first initialization thin-film transistor T4 may be connected to the initialization voltage line VL. The source electrode of the first initialization thin-film transistor T4 may be connected to one electrode of the storage capacitor Cst, the drain electrode of the compensation thin-film transistor T3, and the gate electrode of the driving thin-film transistor T1. The first initialization thin-film transistor T4 may be turned on according to a previous scan signal Sn-1 received through the previous scan line SL-1 to transmit an initialization voltage Vint to the gate electrode of the driving thin-film transistor T1, thereby performing an initialization operation to initialize a voltage of the gate electrode of the driving thin-film transistor Ti.

A gate electrode of the operation control thin-film transistor T5 may be connected to the emission control line EL. A source electrode of the operation control thin-film transistor T5 may be connected to the driving voltage line DVL. A drain electrode of the operation control thin-film transistor T5 may be connected to the source electrode of the driving thin-film transistor T1 and the drain electrode of the data write thin-film transistor T2.

A gate electrode of the emission control thin-film transistor T6 may be connected to the emission control line EL. A source electrode of the emission control thin-film transistor T6 may be connected to the drain electrode of the driving thin-film transistor T1 and the source electrode of the compensation thin-film transistor T3. A drain electrode of the emission control thin-film transistor T6 may be electrically connected to the pixel electrode of the organic light-emitting diode OLED. The operation control thin-film transistor T5 and the emission control thin-film transistor T6 are simultaneously turned on according to an emission control signal En received through the emission control line EL to transmit a first power voltage ELVDD to the organic light-emitting diode OLED, and thus a driving current flows through the organic light-emitting diode OLED.

A gate electrode of the second initialization thin-film transistor T7 may be connected to the previous scan line SL-1. A source electrode of the second initialization thin-film transistor T7 may be connected to the pixel electrode of the organic light-emitting diode OLED. A drain electrode of the second initialization thin-film transistor T7 may be connected to the initialization voltage line VL. The second initialization thin-film transistor T7 may be turned on according to the previous scan signal Sn-1 received through the previous scan line SL-1 to initialize the pixel electrode of the organic light-emitting diode OLED.

In FIG. 3, the first initialization thin-film transistor T4 and the second initialization thin-film transistor T7 are both connected to the previous scan line SL-1; however, according to other embodiments, the first initialization thin-film transistor T4 and the second initialization thin-film transistor T7 may be connected to the previous scan line SL-1 and a next scan line, respectively, and the first initialization thin-film transistor T4 and the second initialization thin-film transistor T7 may operate according to the previous scan signal Sn-1 and a next scan signal, respectively.

Another electrode of the storage capacitor Cst may be connected to the driving voltage line DVL. One electrode of the storage capacitor Cst may be connected to the gate electrode of the driving thin-film transistor T1, the drain electrode of the compensation thin-film transistor T3, and the source electrode of the first initialization thin-film transistor T4.

An opposing electrode (for example, a cathode) of the organic light-emitting diode OLED may receive a second power voltage ELVSS. The organic light-emitting diode OLED may emit light by receiving the driving current from the driving thin-film transistor T1.

Figure 4:
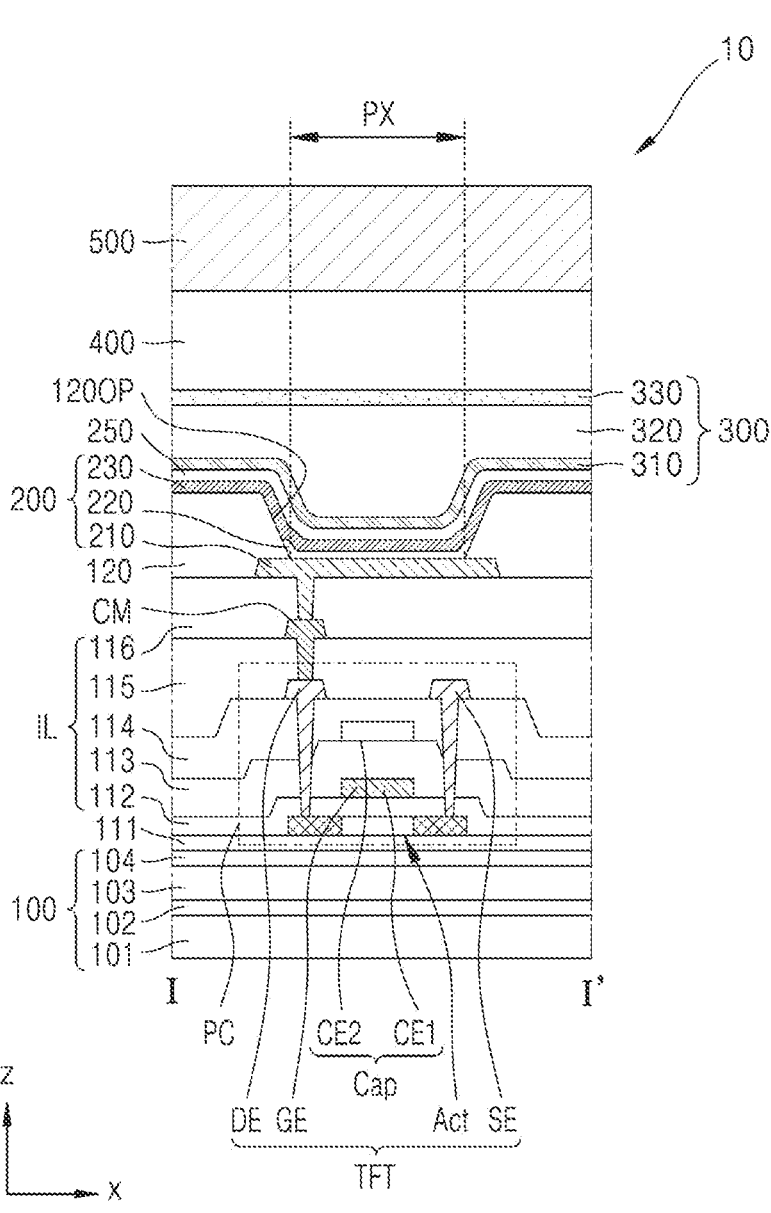
FIG. 4 is a schematic cross-sectional view of a part of the display device taken along the line I-I' of FIG. 1A, according to some embodiments of the present disclosure.

FIG. 4 is a schematic cross-sectional view of a part of the display panel 10 included in the display device 1, according to some embodiments, and may correspond to a cross-sectional view of the display panel 10 taken along the line I-I' of FIG. 1A.

Referring to FIG. 4, the display panel 10 may include a substrate 100. According to some embodiments, the substrate 100 may have a multi-layer structure including an inorganic layer and a base layer including polymer resin. For example, the substrate 100 may include a first base layer 101, a first barrier layer 102, a second base layer 103, and a second barrier layer 104, which are sequentially stacked. The first base layer 101 and the second base layer 103 may include polyimide (PI), polyethersulfone (PES), polyarylate, polyetherimide (PEI), polyethylene naphthalate (PEN), polyethylene terephthalate (PET), polyphenylene sulfide (PPS), polycarbonate (PC), cellulose triacetate (TAC), and/ or cellulose acetate propionate (CAP). The first barrier layer 102 and the second barrier layer 104 may include an inorganic insulating material, such as silicon oxide, silicon oxynitride, silicon nitride, and/or the like. Such a substrate 100 may be flexible.

A buffer layer 111 may be disposed on the substrate 100. The buffer layer 111 may reduce or block penetration of foreign materials, moisture, or ambient air from a bottom portion of the substrate 100 and may provide a flat surface on the substrate 100. The buffer layer 111 may include an inorganic insulating material, such as silicon oxide, silicon oxynitride, silicon nitride, and/or the like, and may have a single layer or multi-layer structure including such a material.

The pixel circuit PC may be provided on the buffer layer 111. The pixel circuit PC may include thin-film transistors TFT and a storage capacitor Cap.

The thin-film transistor TFT of the pixel circuit PC may include a semiconductor layer Act, a gate electrode GE overlapping a channel region of the semiconductor layer Act, and a source electrode SE and drain electrode DE respectively connected to a source region and drain region of the semiconductor layer Act.

The semiconductor layer Act on the buffer layer 111 may include polysilicon. In other examples, the semiconductor layer Act may include amorphous silicon, an oxide semiconductor, or an organic semiconductor. The semiconductor layer Act may include a channel region, and drain region and a source region, which are arranged on opposite sides of the channel region. The drain region and the source region may be a region where impurities are doped.

The gate electrode GE may include a low-resistance metal material. The gate electrode GE may include a conductive material including molybdenum (Mo), aluminum (Al), copper (Cu), titanium (Ti), and/or the like, and may be formed in a multi-layer or single layer including the conductive material.

A first gate insulating layer 112 may be provided between the semiconductor layer Act and the gate electrode GE. The first gate insulating layer 112 may include an inorganic insulating material, such as silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), and/or the like.

A second gate insulating layer 113 may be provided to cover the gate electrode GE. Like the first gate insulating layer 112, the second gate insulating layer 113 may include an inorganic insulating material, such as $SiO_2$, $SiN_X$, SiON, $Al_2O_3$, $TiO_2$, $Ta_2O_5$, $HfO_2$, $ZnO_2$, and/or the like.

According to some embodiments, the storage capacitor Cap may overlap the thin-film transistor TFT. The storage capacitor Cap may include a first electrode CE1 and a second electrode CE2, which overlap each other. According to some embodiments, the gate electrode GE of the thin-film transistor TFT may include the first electrode CE1 of the storage capacitor Cap.

The second electrode CE2 of the storage capacitor Cap may be disposed on the second gate insulating layer 113. The second electrode CE2 may overlap the gate electrode GE therebelow. Here, the gate electrode GE and the second electrode CE2, which overlap each other with the second gate insulating layer 113 therebetween, may form the storage capacitor Cap. In other words, the gate electrode GE overlapping the second electrode CE2 may function as the first electrode CE1 of the storage capacitor Cap. According to other embodiments, the storage capacitor Cap may not overlap the thin-film transistor TFT.

The second electrode CE2 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu, and may have a single layer or multi-layer structure including such a material.

An interlayer insulating layer 114 may cover the second electrode CE2. The interlayer insulating layer 114 may include $SiO_2$, $SiN_X$, SiON, $Al_2O_3$, $TiO_2$, $Ta_2O_5$, $HfO_2$, $ZnO_2$, and/or the like. The interlayer insulating layer 114 may have a single layer or multi-layer structure including the inorganic insulating material described above.

At least a portion of each of the drain electrode DE and the source electrode SE may be disposed on the interlayer insulating layer 114. The drain electrode DE and the source electrode SE may be respectively connected to a drain region D and a source region S through contact holes (e.g., contact openings) of insulating layers therebelow. The drain electrode DE and the source electrode SE may include a material having good conductivity. The drain electrode DE and the source electrode SE may include a conductive material including Mo, Al, Cu, or Ti, and may be formed in a multi-layer or single layer including the above material. According to some embodiments, the drain electrode DE and the source electrode SE may have a multi-layer structure of Ti/Al/Ti.

A first planarization insulating layer 115 may cover the drain electrode DE and the source electrode SE. The first planarization insulating layer 115 may include an organic insulating material, such as a general-purpose polymer, for example, polymethylmethacrylate (PMMA) or polystyrene (PS), a polymer derivate having a phenol-based group, an acrylic-based polymer, an imide-based polymer, an aryle-ther-based polymer, an amide-based polymer, a fluorine-based polymer, a p-xylene-based polymer, a vinyl alcohol-based polymer, or a blend thereof.

A second planarization insulating layer 116 may be disposed on the first planarization insulating layer 115. For example, the second planarization insulating layer 116 may include a same material as the first planarization insulating layer 115, and may include an organic insulating material, such as a general-purpose polymer, for example, PMMA or PS, a polymer derivate having a phenol-based group, an acrylic-based polymer, an imide-based polymer, an arylether-based polymer, an amide-based polymer, a fluorine-based polymer, a p-xylene-based polymer, a vinyl alcohol-based polymer, or a blend thereof.

A light-emitting device 200 may be disposed on the second planarization insulating layer 116. According to some embodiments, the light-emitting device 200 may be an organic light-emitting diode, and may have a stacked structure including a pixel electrode 210, an opposing electrode 230 disposed on the pixel electrode 210, and an intermediate layer 220 provided between the pixel electrode 210 and the opposing electrode 230. The light-emitting device 200 may emit light through an emission region, and for example, may emit red, green, or blue light. Here, the emission region may be defined as the pixel PX.

The pixel electrode 210 may be disposed on the second planarization insulating layer 116. The pixel electrode 210 may be connected to a contact metal CM on the first planarization insulating layer 115 through a contact hole (e.g., a contact opening) formed in the second planarization insulating layer 116. The contact metal CM may be electrically connected to the thin-film transistor TFT of the pixel circuit PC through a contact hole (e.g., a contact opening) formed in the first planarization insulating layer 115. Accordingly, the pixel electrode 210 may be electrically connected to the pixel circuit PC through the contact metal CM, and receives a driving current from the pixel circuit PC.

The pixel electrode 210 may include a conductive oxide, such as indium tin oxide (ITO), indium zinc oxide (IZO), zinc oxide (ZnO), indium oxide (In$_2$O$_3$), indium gallium oxide (IGO), aluminum zinc oxide (AZO), or the like. According to other embodiments, the pixel electrode 210 may include a reflective layer including Ag, Mg, Al, Pt, Pd, Au, Ni, Nd, Ir, Cr, or a compound thereof. According to other embodiments, the pixel electrode 210 may further include a layer formed of ITO, IZO, ZnO, and/or In$_2$O$_3$, on/below the reflective layer. According to other embodiments, the pixel electrode 210 may have a three-layer structure of ITO layer/Ag layer/ITO layer that are sequentially stacked.

A pixel-defining layer 120 may be arranged on the pixel electrode 210. The pixel-defining layer 120 may include an opening 1200P defined by edges of the pixel electrode 210 and overlapping a center portion of the pixel electrode 210. The opening 1200P may define the emission region of light emitted from the light-emitting device 200. A size/width of the opening 1200P may correspond to a size/width of the emission region. Accordingly, a size and/or a width of the pixel PX may be dependent on a size and/or a width of the opening 1200P of the corresponding pixel-defining layer 120.

The pixel-defining layer 120 may increase a distance between the edge of the pixel electrode 210 and the opposing electrode 230 on the pixel electrode 210, thereby preventing or substantially reducing occurrence of an arc (e.g., electric arc) at the edge of the pixel electrode 210. The pixel-defining layer 120 may be formed via a method, such as spin coating, using an organic insulating material, such as polyimide, polyamide, acrylic resin, benzocyclobutene, hexamethyldisiloxane (H M DSO), phenolic resin, or the like.

The intermediate layer 220 may include an emission layer overlapping the pixel electrode 210. The emission layer may include a high-molecular weight organic material or low-molecular weight organic material, which emits light of a certain color. In other examples, the emission layer may include an inorganic light-emitting material or quantum dots.

According to some embodiments, the intermediate layer 220 may include a first functional layer and a second functional layer, which are respectively disposed below and above (e.g., on) the emission layer. The first functional layer is a component disposed below the emission layer, and may include, for example, a hole transport layer (HTL) or may include an HTL and a hole injection layer (HIL). The second functional layer is a component disposed on the emission layer, and may include an electron transport layer (ETL) and/or an electron injection layer (EIL). Like the opposing electrode 230 described below, the first functional layer and/or the second functional layer may be a common layer formed to entirely cover the substrate 100.

The opposing electrode 230 may be disposed on the pixel electrode 210 and may overlap the pixel electrode 210. The opposing electrode 230 may include a conductive material with a low work function. For example, the opposing electrode 230 may include a (semi-)transparent layer including Ag, Mg, Al, Pt, Pd, Au, Ni, Nd, Ir, Cr, Li, Ca, or an alloy thereof. The opposing electrode 230 may further include a layer including ITO, IZO, ZnO, In$_2$O$_3$, and/or the like on the (semi-)transparent layer including such a material. For example, the opposing electrode 230 may be integrally formed to entirely cover the display area DA of FIG. 2.

According to some embodiments, a capping layer 250 may be disposed on the light-emitting device 200. The capping layer 250 may include an inorganic insulating material such as silicon nitride and/or may include an organic insulating material. When the capping layer 250 includes an organic insulating material, the capping layer 250 may include an organic insulating material, such as a triamine derivate, a carbazole biphenyl derivate, an arylene-diamine derivate, tris(8-hydroxyquinolinato)aluminum (Alq3), acryl, polyimide, or polyamide.

An encapsulation layer 300 may be disposed on the capping layer 250. The encapsulation layer 300 may overlap the light-emitting device 200. As described above, the encapsulation layer 300 includes at least one inorganic encapsulation layer and at least one organic encapsulation layer, and according to some embodiments, FIG. 4 illustrates that the encapsulation layer 300 has a stacked structure including a first inorganic encapsulation layer 310, an organic encapsulation layer 320, and a second inorganic encapsulation layer 330.

The first inorganic encapsulation layer 310 and second inorganic encapsulation layer 330 may include one or more inorganic materials from among aluminum oxide, titanium oxide, tantalum oxide, hafnium oxide, zinc oxide, silicon oxide, silicon nitride, and silicon oxynitride. The organic encapsulation layer 320 may include a polymer-based material. Examples of the polymer-based material may include an acrylic resin, an epoxy resin, polyimide, and polyethylene. According to some embodiments, the organic encapsulation layer 320 may include acrylate. The organic encapsulation layer 320 may be formed by curing monomer or applying polymer. The organic encapsulation layer 320 may be transparent or semi-transparent.

A touch detection layer 400 including detection electrodes and trace lines electrically connected to the detection electrodes may be disposed on the encapsulation layer 300. The touch detection layer 400 may obtain coordinate information according to an external input, for example, a touch event. The touch detection layer 400 may detect the external input via a self-capacitance method or a mutual capacitance method.

An optical functional layer 500 may be disposed on the touch detection layer 400. The optical functional layer 500 may reduce reflectance of light (e.g., external light) incident from the outside towards the display panel 10, and/or enhance color purity of light emitted from the display panel 10.

According to some embodiments, the optical functional layer 500 may include a retarder and/or a polarizer. The retarder may be a film type or liquid crystal coating type, and may include a half wavelength ($\lambda/2$) retarder and/or a quarter wavelength ($\lambda/4$) retarder. The polarizer may also be a film type or a liquid crystal coating type. The film type may include an elongated synthetic resin film, and the liquid crystal coating type may include liquid crystals arranged in a certain arrangement. The retarder and the polarizer may further include a protection film.

According to other embodiments, the optical functional layer 500 may include a destructive interference structure. The destructive interference structure may include a first reflective layer and a second reflective layer arranged on different layers. A first reflective light and a second reflective light reflected respectively from the first reflective layer and the second reflective layer may destructively interfere with each other, and accordingly, reflectance of an external light may be reduced.

Hereinabove, the display panel 10 includes the organic light-emitting diode OLED as the light-emitting device 200; however, the display panel 10 of the present disclosure is not limited thereto. According to other embodiments, the display panel 10 may be a display panel including an inorganic light-emitting diode, that is, may be an inorganic light-emitting display panel. According to other embodiments, the display panel 10 may be a quantum dot light-emitting display panel.

Figure 5:
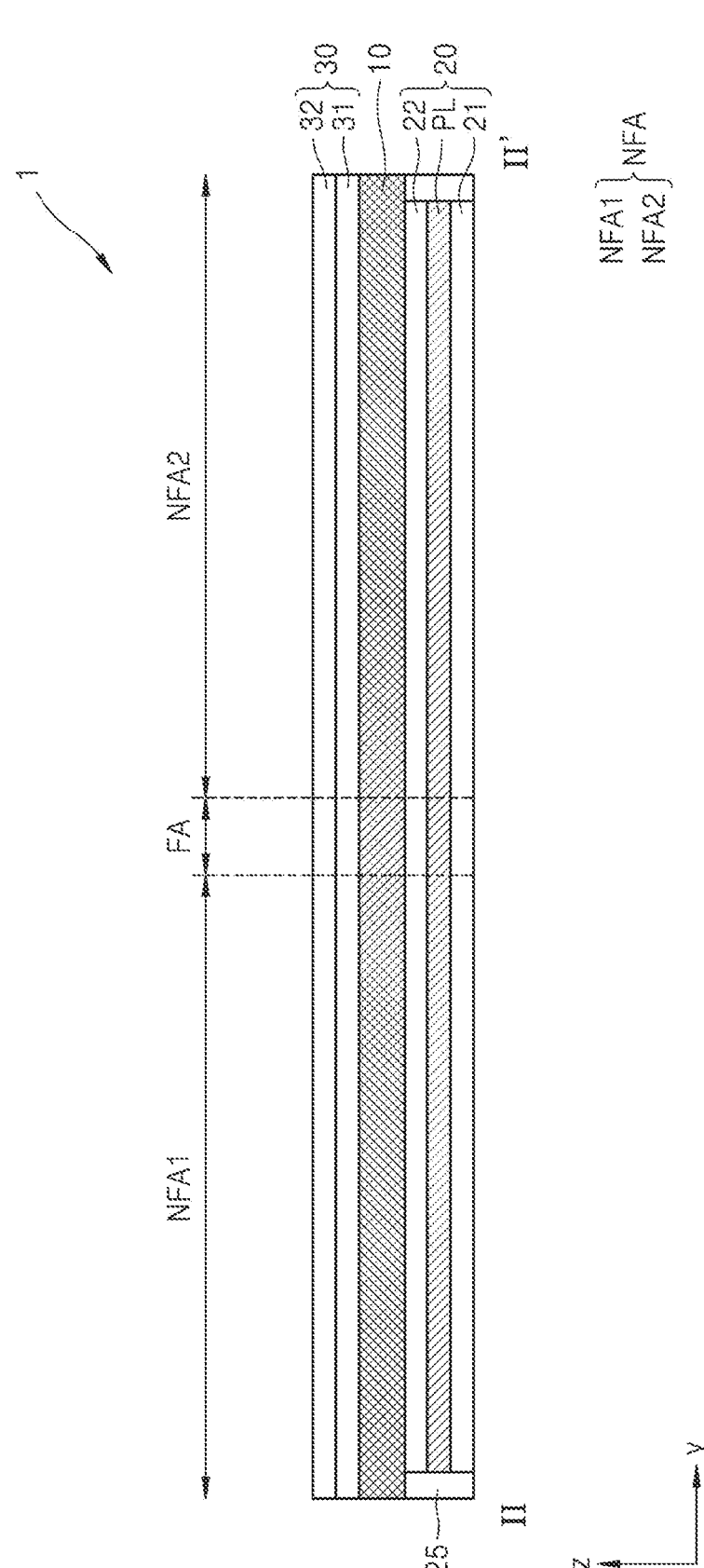
FIG. 5 is a schematic cross-sectional view of the display device taken along the line II-II' of FIG. 1A, according to some embodiments of the present disclosure.
Figure 6:
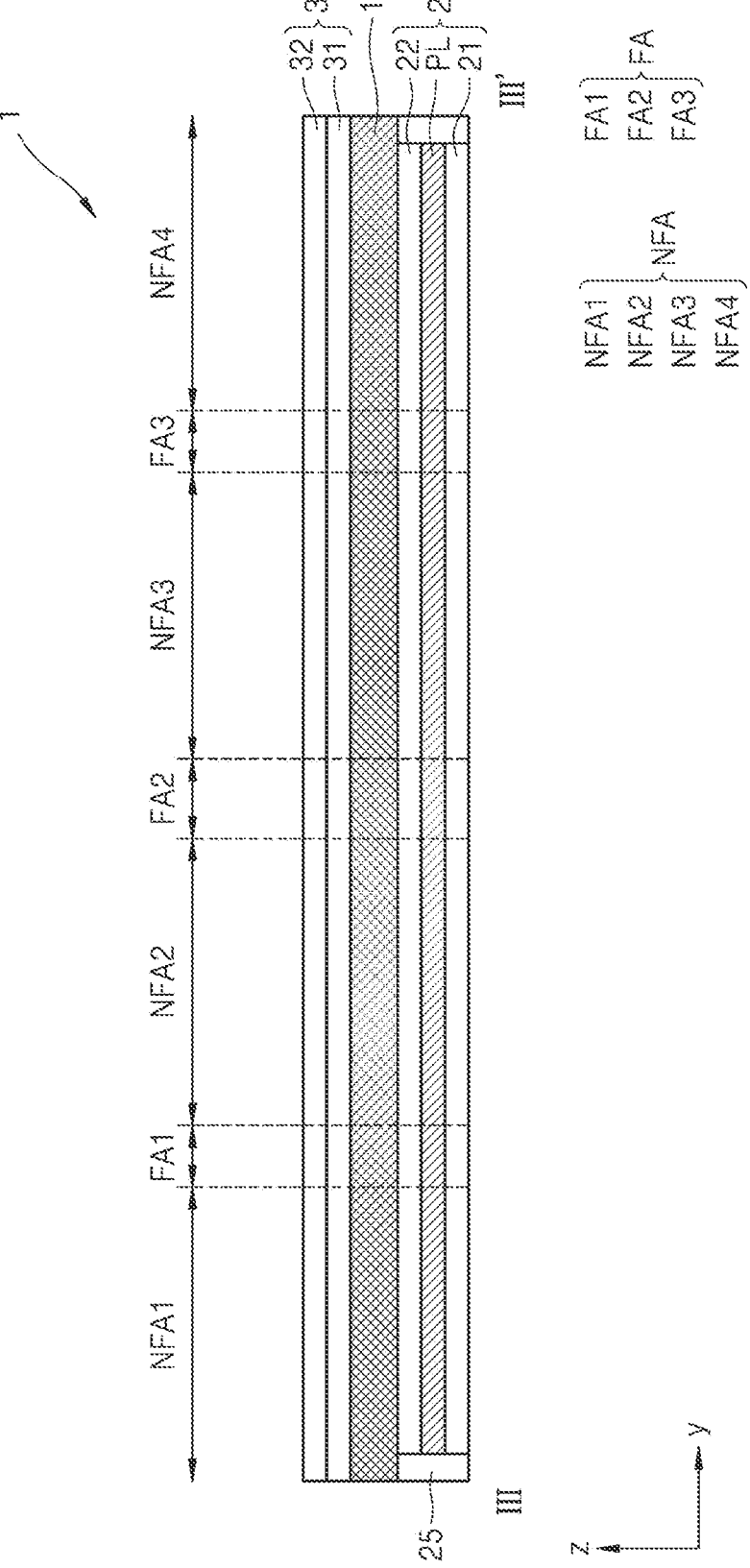
FIG. 6 is a schematic cross-sectional view of the display device taken along the line III-III' of FIG. 1B, according to some embodiments of the present disclosure.

FIG. 5 is a schematic cross-sectional view of the display device 1 taken along the line II-II' of FIG. 1A, according to some embodiments of the present disclosure. FIG. 6 is a schematic cross-sectional view of the display device 1 taken along the line III-III' of FIG. 1B, according to some embodiments of the present disclosure.

Referring to FIGS. 5 and 6, the display device 1 may include the display panel 10, a support plate 20 disposed below the display panel 10, and an upper stacked structure 30 disposed on the display panel 10. The display device 1 may further include an encapsulation material 25 arranged to surround an edge of the support plate 20. The display device 1 may further include, between the display panel 10 and the support plate 20, a cushion layer preventing the display panel 10 from being damaged or substantially reducing damage thereto by absorbing an external impact; however, embodiments of the present disclosure are not limited thereto.

As described above, the display panel 10 may include the non-foldable areas NFA and the foldable area FA provided between the non-foldable areas NFA. As shown in FIG. 5, the non-foldable area NFA may include the first non-foldable area NFA1 and the second non-foldable area NFA2. The first non-foldable area NFA1 may be provided at one side of the foldable area FA and the second non-foldable area NFA2 may be provided at the other side of the foldable area FA that is opposite to the first non-foldable area NFA1. As shown in FIG. 6, the display panel 10 may include a plurality of the foldable areas FA. For example, the display panel 10 may include the first foldable area FA1, the second foldable area FA2, and the third foldable area FA3. The first foldable area FA1, the second foldable area FA2, and the third foldable area FA3 may be provided between respective ones of the first non-foldable area NFA1, the second non-foldable area NFA2, the third non-foldable area NFA3, and the fourth non-foldable area NFA4 to separate the first non-foldable area NFA1, the second non-foldable area NFA2, the third non-foldable area NFA3, and the fourth non-foldable area NFA4.

The display panel 10 may provide an image. In other words, the display area DA of FIG. 1A may be formed as the plurality of pixels PX of FIG. 1A are arranged in the display panel 10. The display panel 10 may have a stacked structure as described with reference to FIG. 4. In other words, as shown in FIG. 4, the display panel 10 may include the substrate 100, the thin-film transistor TFT, the storage capacitor Cap, the light-emitting device 200, the encapsulation layer 300, the touch detection layer 400, and the optical functional layer 500.

The support plate 20 supports the display panel 10 and may provide rigidity to the display device 1.

The support plate 20 may include a porous metal layer PL including a porous metal material. The porous metal material included in the porous metal layer PL may be formed by dissolving a metal, adding a foaming agent to the dissolved metal, and dispersing foaming through high-speed stirring. For example, the porous metal layer PL may include porous AL, porous Cu, porous Ti, and/or the like. As the support plate 20 includes the porous metal layer PL including the porous metal material, impact power applied to the display panel 10 may be decreased by increasing an impact time during an impact with another object. In other words, as the support plate 20 includes the porous metal layer PL, impact resistance may be enhanced (e.g., increased).

According to some embodiments, the support plate 20 may include the porous metal layer PL, an upper support layer 22 disposed on the porous metal layer PL, and a lower support layer 21 disposed below the porous metal layer PL. According to some embodiments, the porous metal layer PL may be provided between the upper support layer 22 and the lower support layer 21. According to some embodiments, the porous metal layer PL may be arranged in the foldable area FA and the non-foldable areas NFA; however, embodiments of the present disclosure are not limited thereto. According to other embodiments, an arrangement of the porous metal layer PL may vary.

According to some embodiments, the support plate 20 has a three-layer structure including the porous metal layer PL, the upper support layer 22, and the lower support layer 21; however, embodiments of the present disclosure are not limited thereto. For example, the support plate 20 may have a two-layer structure including the porous metal layer PL and the upper support layer 22 disposed on the porous metal layer PL. In other words, the lower support layer 21 may be omitted according to some embodiments.

The upper support layer 22 may be provided between the display panel 10 and the porous metal layer PL. The upper support layer 22 may be entirely arranged in the foldable area FA and the non-foldable areas NFA to disperse or spread the force/effect of an external impact. The upper support layer 22 may have different density from the porous metal layer PL. For example, the upper support layer 22 may include a different material from the porous metal layer PL or, even when the upper support layer 22 includes a same material as the porous metal layer PL, the upper support layer 22 may include a material that is not porous or has different porosity. According to some embodiments, the upper support layer 22 may include an opaque material that blocks light.

Such an upper support layer 22 may include, for example, SUS, Ti, Ti alloy, Al, Al alloy, Cu, Cu alloy, CFRP, GFRP, and/or the like. The upper support layer 22 may be provided between the display panel 10 and the porous metal layer PL, thereby preventing display quality from being deteriorated, or substantially reducing deterioration thereof, due to a porous material of the porous metal layer PL.

The lower support layer 21 may be spaced apart from the upper support layer 22 with the porous metal layer PL therebetween. The lower support layer 21 may be entirely arranged in the foldable area FA, the first non-foldable area NFA1, and the second non-foldable area NFA2. The lower support layer 21 may have a different density from the porous metal layer PL. For example, the lower support layer 21 may include a different material from the porous metal layer PL or, even when the lower support layer 21 includes a same material as the porous metal layer PL, the lower support layer 21 may include a material that is not porous or has different porosity. According to some embodiments, the lower support layer 21 may include an opaque material that blocks light. Such a lower support layer 21 may include, for example, SUS, Ti, Ti alloy, Al, Al alloy, Cu, Cu alloy, CFRP, GFRP, and/or the like.

A structure in which the porous metal layer PL, the upper support layer 22, and the lower support layer 21 are entirely arranged in the foldable area FA and the non-foldable areas NFA may be formed through an overlay clad process in which different materials are stacked, rolled, and bound together. However, a forming method is not limited thereto. For example, the structure in which the porous metal layer PL, the upper support layer 22, and the lower support layer 21 are entirely arranged in the foldable area FA and the non-foldable areas NFA may be formed through a method of filling foams of a porous material or coating on the foams.

The encapsulation material 25 may surround the edge of the support plate 20. The encapsulation material 25 may surround the edge of the porous metal layer PL such that the porous metal layer PL is not externally exposed. The encapsulation material 25 may prevent the porous metal layer PL from being oxidized or substantially reduced oxidation thereof. The encapsulation material 25 may include a conductive spacer including a conductive material. By including the conductive spacer, thermal conductivity of the display device 1 is increased, and thus a heat dissipation effect may be provided. Also, by including the conductive spacer, a ground of the display device 1 is increased, and thus electromagnetic interference (EMI) may be prevented or substantially reduced.

The upper stack structure 30 may include a cover window 31 and an external protection layer 32.

The cover window 31 may be disposed on the display panel 10. The cover window 31 may have high transmissivity so as to transmit light emitted from the display panel 10. Also, the cover window 31 may have strong stiffness and hardness to protect the display device 1 from an external impact. The cover window 31 may include, for example, glass or plastic. According to some embodiments, the cover window 31 may be ultra-thin-film tempered glass in which intensity is reinforced through a chemical reinforcement or thermal reinforcement method.

The external protection layer 32 may be disposed on the cover window 31. The external protection layer 32 may entirely cover a top surface of the cover window 31. The external protection layer 32 may absorb an external impact and prevent or substantially reduce the scratching of the cover window 31. The external protection layer 32 may include a urethane-based material or polymer resin, such as polyimide or polyethylene.

Figure 7:
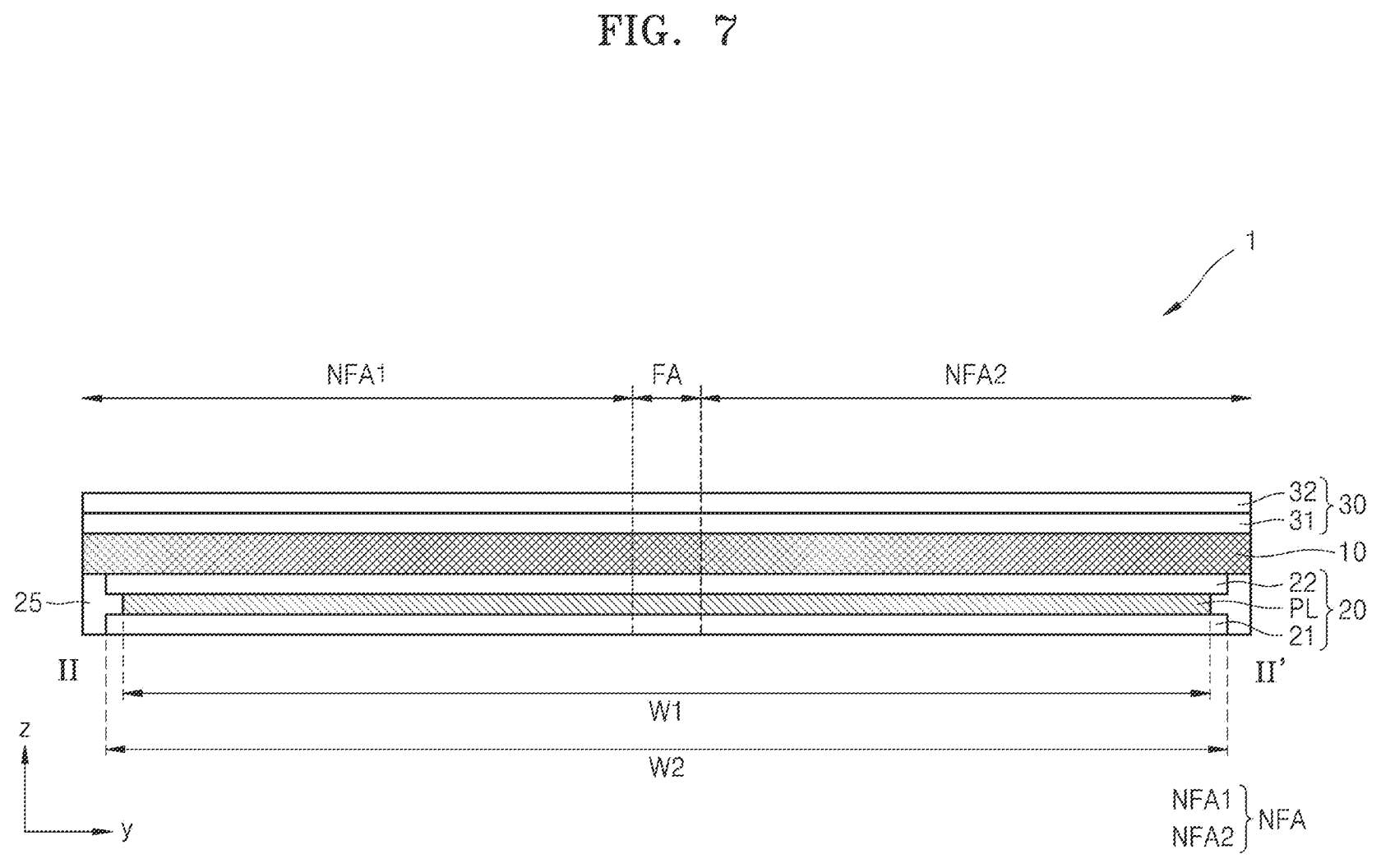

FIG. 7 is a schematic cross-sectional view of the display device 1 taken along the line II-II' of FIG. 1A, according to some embodiments. In FIG. 7, details identical to those described with reference to FIGS. 1A through 5 are omitted and modified features and differences will be described.

Referring to FIG. 7, a portion of a side surface of the support plate 20 may be concave. The porous metal layer PL may have a different width from the upper support layer 22 and lower support layer 21. For example, a width W1 of the porous metal layer PL in the second direction (y-axis direction) may be less than a width W2 of the upper support layer 22 in the second direction (y-axis direction). Also, the width W1 of the porous metal layer PL in the second direction (y-axis direction) may be less than the width W2 of the lower support layer 21 in the second direction (y-axis direction). FIG. 7 illustrates only a width in the second direction (y-axis direction); however, embodiments of the present disclosure are not limited thereto, and a width of the porous metal layer PL in the first direction (x-axis direction) of FIG. 1A may be less than a width of the upper support layer 22 and a width of the lower support layer 21 in the first direction (x-axis direction) of FIG. 1A. According to some embodiments, the width W2 of the upper support layer 22 in the second direction (y-axis direction) and the width W2 of the lower support layer 21 in the second direction (y-axis direction) are the same; however, embodiments of the present disclosure are not limited thereto.

The encapsulation material 25 may surround the edge of the support plate 20. The encapsulation material 25 may surround the edges of the porous metal layer PL. The encapsulation material 25 may include a portion protruding to fill a concave shape (e.g., an indentation) generated by a width difference between the porous metal layer PL and the upper support layer 22 and lower support layer 21. In other words, the encapsulation material 25 may include a portion protruding in a direction towards the porous metal layer PL. A portion of the encapsulation material 25, which overlaps the porous metal layer PL in, for example, the second direction (y-axis direction), may protrude towards the porous metal layer PL more than a portion of the encapsulation material 25, which overlaps the upper support layer 22 in, for example, the second direction (y-axis direction).

Figure 8:
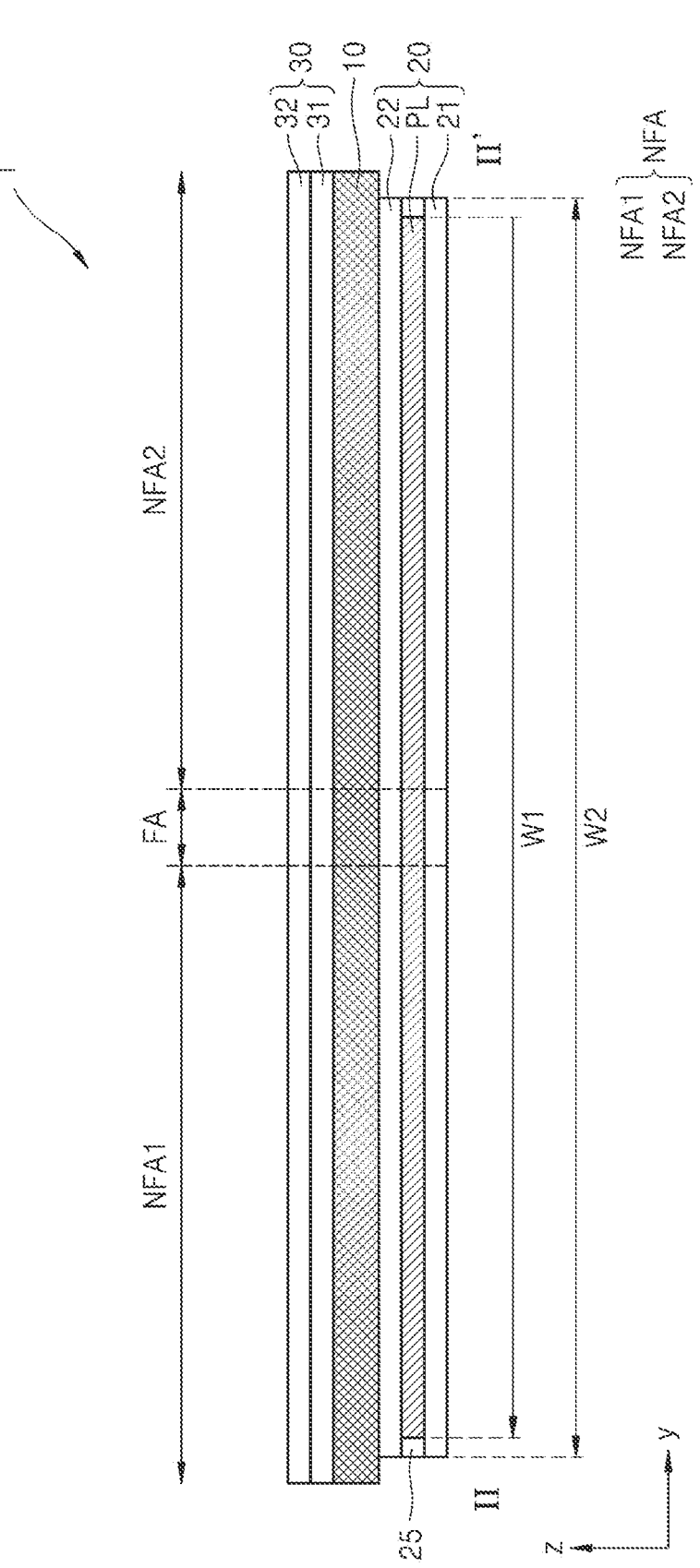
FIG. 8 is a schematic cross-sectional view of the display device taken along the line II-II' of FIG. 1A, according to some embodiments of the present disclosure.

FIG. 8 is a schematic cross-sectional view of the display device 1 taken along the line II-II' of FIG. 1A, according to some embodiments. In FIG. 8, details identical to those described with reference to FIGS. 1A through 5 are omitted and modified features and differences will be described.

Referring to FIG. 8, the portion of the side surface of the support plate 20 may be concave. The encapsulation material 25 may surround only the edge of the porous metal layer PL. The encapsulation material 25 may not be disposed on the upper support layer 22 and lower support layer 21. The encapsulation material 25 may be arranged to fill the concave shape (e.g., the indentation) generated by the width difference between the porous metal layer PL and the upper support layer 22 and lower support layer 21. The porous metal layer PL may not be externally exposed by the encapsulation material 25.

The porous metal layer PL may have a different width from the upper support layer 22 and lower support layer 21. For example, the width W1 of the porous metal layer PL in the second direction (y-axis direction) may be less than the width W2 of the upper support layer 22 in the second direction (y-axis direction). Also, the width W1 of the porous metal layer PL in the second direction (y-axis direction) may be less than the width W2 of the lower support layer 21 in the second direction (y-axis direction). FIG. 8 illustrates only a width in the second direction (y-axis direction); however, embodiments of the present disclosure are not limited thereto, and the width of the porous metal layer PL in the first direction (x-axis direction) of FIG. 1B may be less than the width of the upper support layer 22 and the width of the lower support layer 21 in the first direction (x-axis direction) of FIG. 1B. According to some embodiments, the width of the upper support layer 22 and the width of the lower support layer 21 are the same; however, embodiments of the present disclosure are not limited thereto.

Figure 9:
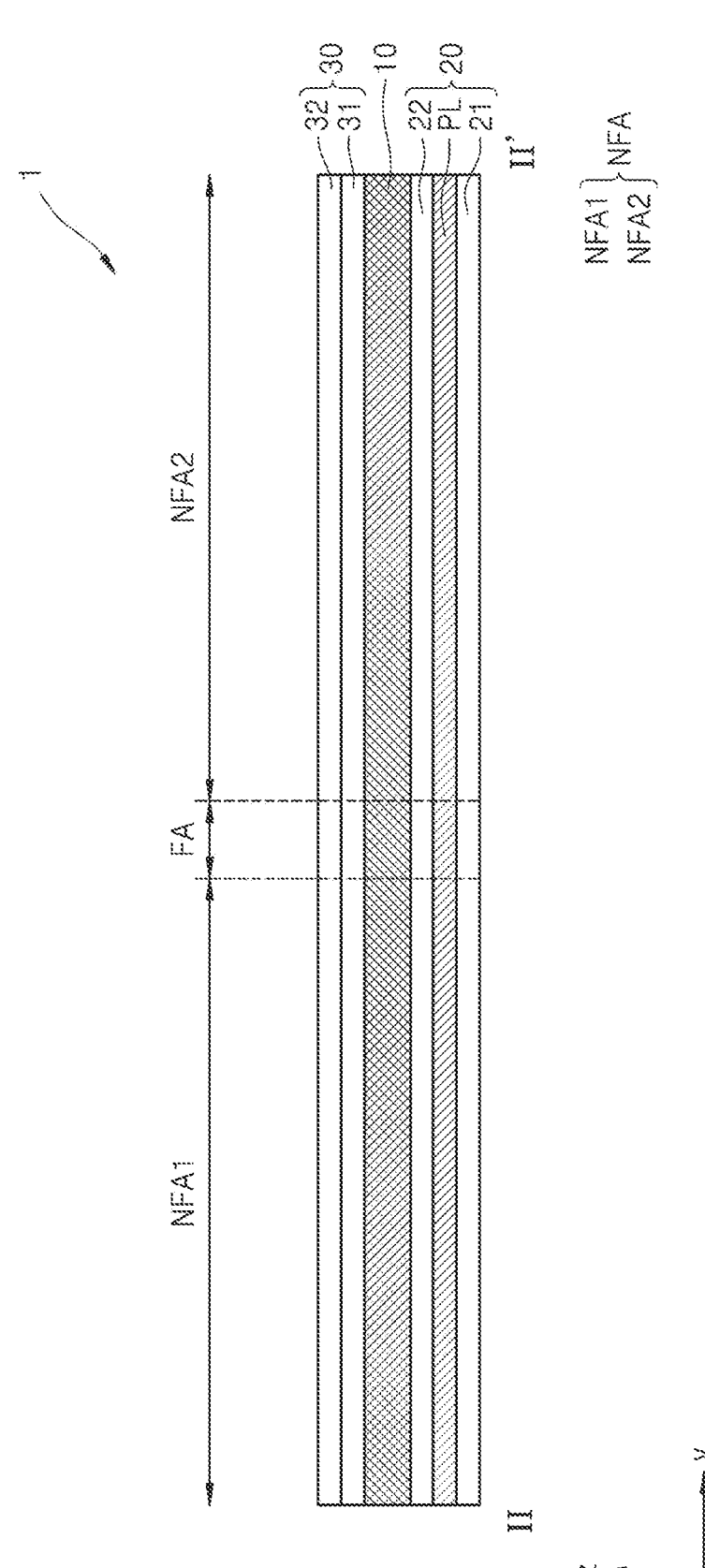
FIG. 9 is a schematic cross-sectional view of the display device taken along the line II-II' of FIG. 1A, according to some embodiments of the present disclosure.

FIG. 9 is a schematic cross-sectional view of the display device 1 taken along the line II-II' of FIG. 1A, according to some embodiments of the present disclosure.

Referring to FIG. 9, the support plate 20 may not include the encapsulation material 25 of FIG. 5. The support plate 20 may include the porous metal layer PL on which a post-anodizing process has been performed. The porous metal layer PL may further include, at a side surface portion, an oxide layer according to an anodizing process. The support plate 20 may include the upper support layer 22 disposed on the porous metal layer PL and the lower support layer 21 disposed below the porous metal layer PL. According to some embodiments, the lower support layer 21 may be omitted.

The embodiments described with reference to FIGS. 7 through 9 may include a structure in which the porous metal layer PL, the upper support layer 22, and the lower support layer 21 are entirely arranged in the foldable area FA and the non-foldable areas NFA. The embodiments described with reference to FIGS. 7 through 9 may be formed by, as described above with reference to FIG. 5, an overlay clad process or by filling foams of a porous material or coating on the foams.

FIGS. 7 through 9 describe only the embodiments along the line II-II' of FIG. 1A; however, embodiments of the present disclosure are not limited thereto, and features described with reference to FIGS. 7 through 9 may also be applied to some embodiments including the plurality of foldable areas FA along the line III-III' described with reference to FIG. 1B.

Figure 10:
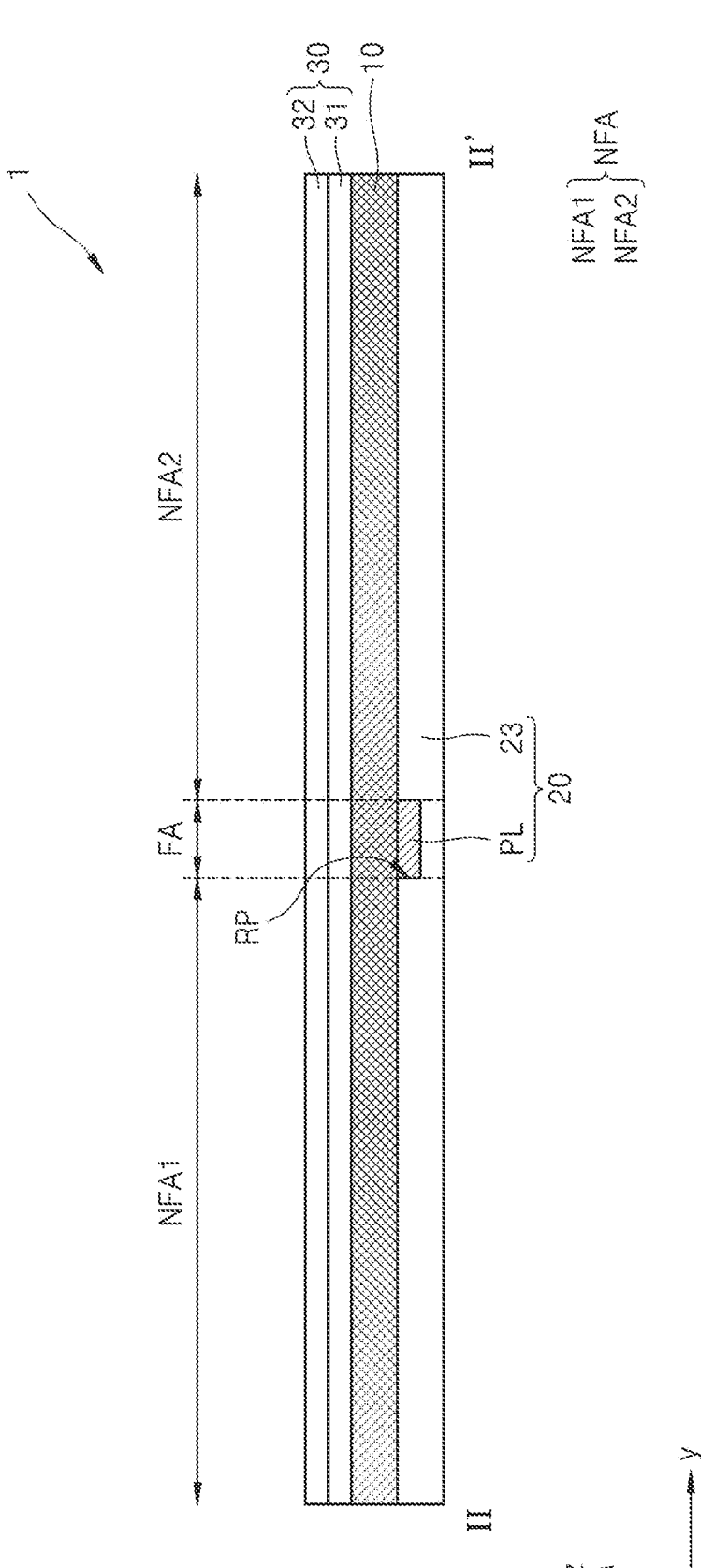
FIG. 10 is a schematic cross-sectional view of the display device taken along the line II-II' of FIG. 1A, according to some embodiments of the present disclosure.

FIG. 10 is a schematic cross-sectional view of the display device 1 taken along the line II-II' of FIG. 1A, according to some embodiments of the present disclosure.

Referring to FIG. 10, the support plate 20 may include the porous metal layer PL and a support layer 23.

The porous metal layer PL may overlap the foldable area FA in a direction perpendicular to a top surface of the display panel 10, for example, in a z-axis direction. The porous metal layer PL may include a porous metal material. For example, the porous metal layer PL may include porous AL, porous Cu, or porous Ti.

The support layer 23 may surround at least a side surface of the porous metal layer PL. According to some embodiments, the support layer 23 may surround a side surface and a bottom surface of the porous metal layer PL. The support layer 23 may include a recess portion RP having a concave shape (e.g., an indentation) in a direction opposite to (e.g., away from) the display panel 10, for example, in a −z-axis direction, in a region overlapping the foldable area FA. The porous metal layer PL may be disposed on the recess portion RP of the support layer 23. A top surface of the porous metal layer PL and a top surface of the support layer 23 may be arranged on substantially the same x-y plane. For example, a vertical level of the top surface of the porous metal layer PL and the top surface of the support layer 23 may be substantially the same. The vertical level may be defined as a height at which one surface is arranged in the z-axis direction.

The support layer 23 may be entirely arranged in the foldable area FA and the non-foldable areas NFA to disperse or spread the force/effect of an external impact. The support layer 23 may have different density from the porous metal layer PL. For example, the support layer 23 may include a different material from the porous metal layer PL or, even when the support layer 23 includes a same material as the porous metal layer PL, the material may not be porous or may have different porosity. The support layer 23 may include, for example, SUS, Ti, Ti alloy, Al, Al alloy, Cu, Cu alloy, CFRP, GFRP, and/or the like.

As shown in FIG. 10, a structure in which the porous metal layer PL is arranged in a region overlapping the foldable area FA and the support layer 23 is entirely arranged in the foldable area FA and the non-foldable areas NFA may be formed by an inlay clad process in which the recess portion RP of the support layer 23 is formed and then a porous material is inserted into the recess portion RP to be rolled and bound together.

Figure 11:
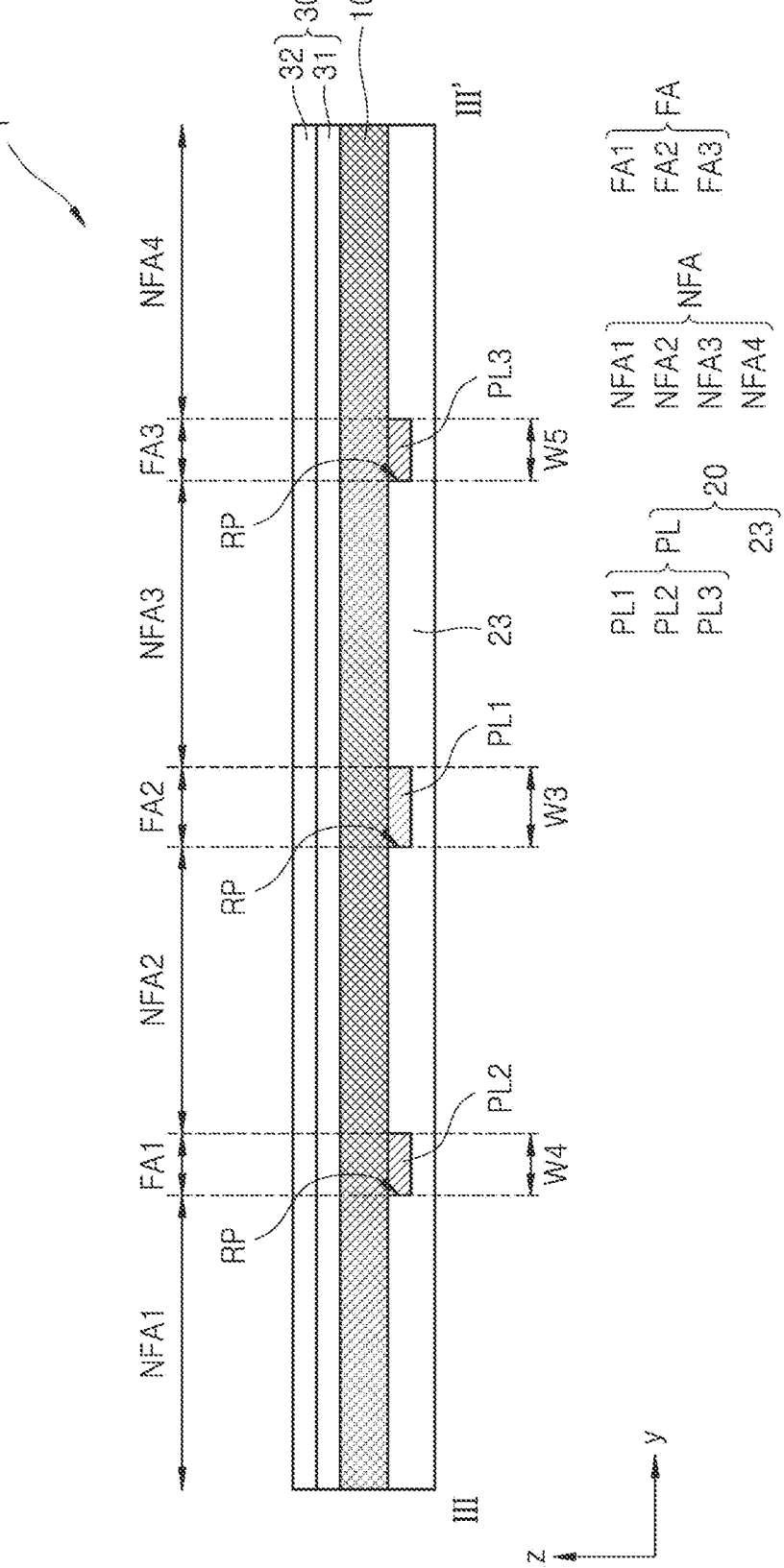
FIG. 11 is a schematic cross-sectional view of the display device taken along the line III-III' of FIG. 1B, according to some embodiments of the present disclosure.

FIG. 11 is a schematic cross-sectional view of the display device 1 taken along the line III-III' of FIG. 1B, according to some embodiments of the present disclosure. In FIG. 11, details identical to those described with reference to FIG. 10 are omitted and modified features and differences will be described.

Referring to FIG. 11, the display panel 10 may include a plurality of the foldable areas FA. For example, the display panel 10 may include the first foldable area FA1, the second foldable area FA2, and the third foldable area FA3. The second foldable area FA2 may be arranged between the first foldable area FA1 and the third foldable area FA3, and may be arranged in a center portion of the display panel 10. The first foldable area FA1, the second foldable area FA2, and the third foldable area FA3 may be provided between respective ones of the first non-foldable area NFA1, the second non-foldable area NFA2, the third non-foldable area NFA3, and the fourth non-foldable area NFA4 to separate the first non-foldable area NFA1, the second non-foldable area NFA2, the third non-foldable area NFA3, and the fourth non-foldable area NFA4.

The porous metal layer PL may include a first porous metal layer PL1, a second porous metal layer PL2, and a third porous metal layer PL3, which overlap the foldable areas FA. The first porous metal layer PL1 may overlap the second foldable area FA2 arranged in the center portion of the display panel 10. The second porous metal layer PL2 may overlap the first foldable area FA1 and the third porous metal layer PL3 may overlap the third foldable area FA3. A width W3 of the first porous metal layer PL1 in the y-axis direction may be greater than a width W4 of the second porous metal layer PL2 in the y-axis direction. The width W3 of the first porous metal layer PL1 in the y-axis direction may be greater than a width W5 of the third porous metal layer PL3 in the y-axis direction. However, the number of porous metal layers PL is not limited to those illustrated, and may vary according to the number of foldable areas FA. Hereinafter, for convenience of description, the disclosure is described based on some embodiments in which there are three foldable areas FA.

The support layer 23 may surround at least a side surface of the porous metal layer PL. According to some embodiments, the support layer 23 may surround a side surface and a bottom surface of each of the plurality of porous metal layers PL. For example, the support layer 23 may surround the side surface and the bottom surface of each of the first to third porous metal layers PL1 to PL3. The support layer 23 may include the recess portions RP having concave shapes (e.g., having stepped indentation shapes) in the direction opposite to (e.g., away from) the display panel 10, for example, in the −z-axis direction, in a region overlapping the first to third folding areas FA1 to FA3. Each of the first to third porous metal layers PL1 to PL3 may be arranged on the recess portion RP of the support layer 23. A distance from the top surface of each of the first to third porous metal layers PL1 through PL3 to the display panel 10 may be substantially the same as a distance from the top surface of the support layer 23 to the display panel 10.

As shown in FIG. 11, a structure in which the porous metal layers PL are arranged in a region overlapping the foldable area FA and the support layer 23 is entirely arranged in the foldable area FA and the non-foldable areas NFA may be formed by an inlay clad process in which the recess portions RP of the support layer 23 are formed and then a porous material is inserted into the recess portions RP to be rolled and bound together.

Figure 12:
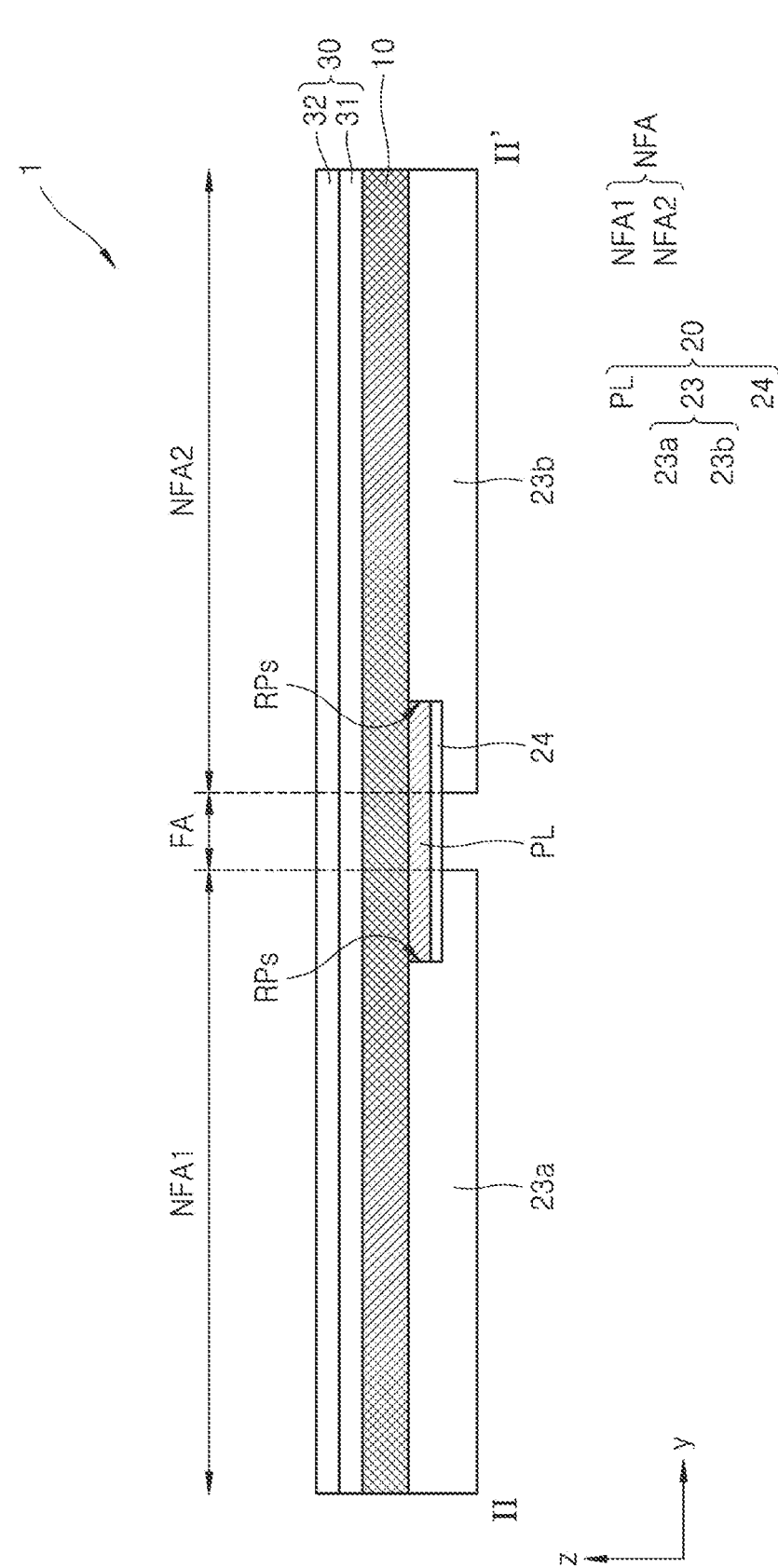
FIG. 12 is a schematic cross-sectional view of the display device taken along the line II-II' of FIG. 1A, according to some embodiments of the present disclosure.

FIG. 12 is a schematic cross-sectional view of the display device 1 taken along the line II-II' of FIG. 1A, according to some embodiments of the present disclosure.

Referring to FIG. 12, the support plate 20 may include the porous metal layer PL and the support layer 23.

At least a portion of the porous metal layer PL may overlap the foldable area FA in a direction perpendicular to the top surface of the display panel 10, for example, in the z-axis direction. The porous metal layer PL may include a porous metal material. For example, the porous metal layer PL may include porous AL, porous Cu, or porous Ti.

The support layer 23 may not overlap the foldable area FA in the z-axis direction. A portion of the bottom surface of the porous metal layer PL may not overlap the support layer 23 in the z-axis direction.

The support layer 23 may surround at least a side surface of the porous metal layer PL. According to some embodiments, the support layer 23 may surround portions of the side surface and bottom surface of the porous metal layer PL. According to some embodiments, the support layer 23 may include a first support layer 23a and a second support layer 23b spaced apart from each other in the second direction, for example, the y-axis direction. The first support layer 23a may surround portions of the side surface and bottom surface of the porous metal layer PL. The second support layer 23b may surround portions of the side surface and bottom surface of the porous metal layer PL.

The first support layer 23a and the second support layer 23b may include side recess portions RPs having a concave shape (e.g., a stepped indentation shape) in a direction opposite to (e.g., away from) the display panel 10 (for example, the −z-axis direction), in regions where the foldable area FA and portions of adjacent non-foldable areas NFA overlap each other.

The porous metal layer PL may be disposed on the support layer 23. The porous metal layer PL may be disposed on the first support layer 23a and the second support layer 23b. The porous metal layer PL may be disposed on the side recess portion RPs of the first support layer 23a and disposed on the side recess portion RPs of the second support layer 23b. According to some embodiments, the porous metal layer PL including one layer may be disposed on the first support layer 23a and the second support layer 23b. The porous metal layer PL may include a first portion overlapping the first non-foldable area NFA1 and disposed on the first support layer 23a, a second portion overlapping the foldable area FA and not overlapping the support layer 23, and a third portion overlapping the second non-foldable area NFA2 and disposed on the second support layer 23b.

An adhesive layer 24 may be disposed below the porous metal layer PL. The adhesive layer 24 may be arranged between the first support layer 23a and the porous metal layer PL, and between the second support layer 23b and the porous metal layer PL. The adhesive layer 24 may include a first portion overlapping the first non-foldable area NFA1 that is arranged between the first support layer 23a and the porous metal layer PL, a second portion overlapping the foldable area FA and not overlapping the support layer 23, and a third portion overlapping the second non-foldable area NFA2 that is arranged between the second support layer 23b and the porous metal layer PL. For example, the adhesive layer 24 may be an optically clear adhesive (OCA) or a pressure sensitive adhesive (PSA).

The top surface of the porous metal layer PL and a top surface of the first support layer 23a may be arranged on substantially a same x-y plane. For example, a vertical level of the top surface of the porous metal layer PL and the top surface of the first support layer 23a may be substantially the same. The top surface of the porous metal layer PL and a top surface of the second support layer 23b may be arranged on substantially a same x-y plane. For example, a vertical level of the top surface of the porous metal layer PL and the top surface of the second support layer 23b may be substantially the same. The vertical level may be defined as a height at which one surface is arranged in the z-axis direction.

The support layer 23 according to some embodiments may be a layer arranged in the non-foldable areas NFA to disperse or spread the force/effect of an external impact. The support layer 23 may have different density from the porous metal layer PL. For example, the support layer 23 may include a different material from the porous metal layer PL or, even when the support layer 23 includes a same material as the porous metal layer PL, the material may not be porous or may have different porosity. The support layer 23 may include, for example, SUS, Ti, Ti alloy, Al, Al alloy, CFRP, GFRP, and/or the like.

As shown in FIG. 12, a structure in which the porous metal layer PL is arranged in a region overlapping the foldable area FA and the support layer 23 is entirely arranged in the non-foldable areas NFA may be formed by an inlay clad process in which the side recess portions RPs of the first and second support layers 23a and 23b are formed and then a porous material is inserted into the side recess portions RPs to be rolled and bound together.

Figure 13:
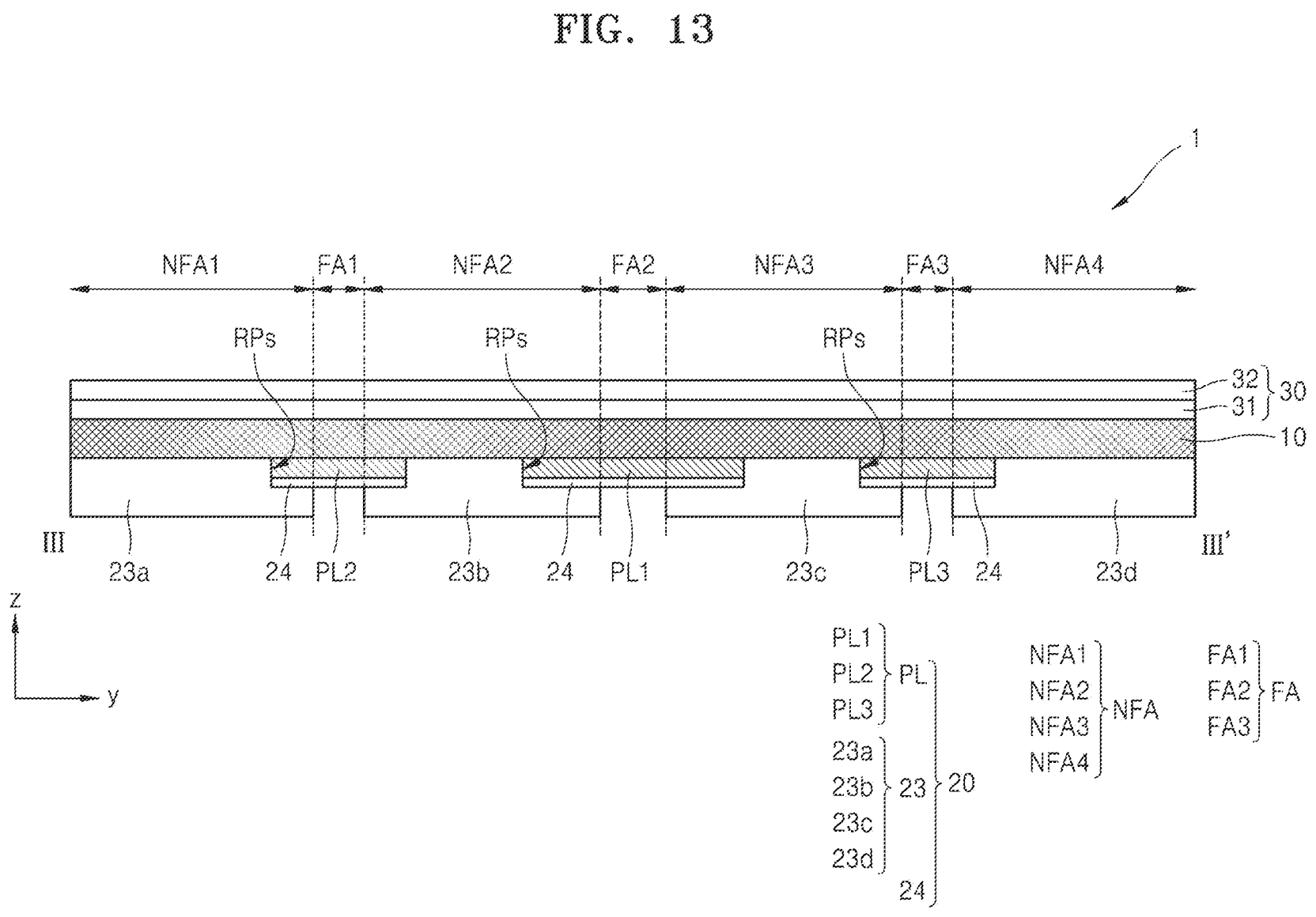

FIG. 13 is a schematic cross-sectional view of the display device 1 taken along the line III-III' of FIG. 1B, according to some embodiments of the present disclosure. In FIG. 13, details identical to those described with reference to FIG. 12 are omitted and modified features and differences will be described.

Referring to FIG. 13, there may be a plurality of the porous metal layers PL overlapping respective ones of the plurality of foldable areas FA. The porous metal layers PL may include the first porous metal layer PL1 overlapping the second foldable area FA2, the second porous metal layer PL2 overlapping the first foldable area FA1, and the third porous metal layer PL3 overlapping the third foldable area FA3.

The support layer 23 may include the first support layer 23a, the second support layer 23b, a third support layer 23c, and a fourth support layer 23d, which are spaced apart from each other in the second direction, for example, the y-axis direction. The first support layer 23a and the second support layer 23b may surround portions of a side surface and bottom surface of the second porous metal layer PL2. The second support layer 23b and the third support layer 23c may surround portions of a side surface and bottom surface of the first porous metal layer PL1. The third support layer 23c and the fourth support layer 23d may surround portions of a side surface and bottom surface of the third porous metal layer PL3.

The first to fourth support layers 23a to 23d may include side recess portions RPs having a concave shape (e.g., a stepped indentation) in the direction opposite to (e.g., away from) the display panel 10 (for example, the –z-axis direction), in the regions where the foldable area FA and the portions of adjacent non-foldable areas NFA overlap each other.

The porous metal layers PL may be disposed on the support layer 23. Each of the porous metal layers PL may be arranged between and disposed on the respective ones of the adjacent support layers 23. For example, the first porous metal layer PL1 may be arranged between the second support layer 23b and the third support layer 23c, and disposed on the second support layer 23b and the third support layer 23c. Each porous metal layer PL may be disposed on the side recess portions RPs of respective ones of the support layers 23.

The adhesive layer 24 may be disposed below the porous metal layer PL. The adhesive layer 24 may be arranged between the support layer 23 and the porous metal layer PL. A distance from the top surface of the porous metal layer PL to the display panel 10 may be substantially the same as a distance from the top surface of each support layer 23 to the display panel 10.

The support layer 23 according to some embodiments may be a layer arranged in the non-foldable areas NFA to disperse or spread the force/effect of an external impact. The support layer 23 may have different density from the porous metal layer PL. For example, the support layer 23 may include a different material from the porous metal layer PL or even when the support layer 23 includes a same material as the porous metal layer PL, the material may not be porous or may have different porosity. The support layer 23 may include, for example, SUS, Ti, Ti alloy, Al, Al alloy, Cu, Cu alloy, CFRP, GFRP, and/or the like.

According to some embodiments, a display device in which impact resistance is enhanced (e.g., increased) may be realized as a support substrate disposed below a display panel includes a porous metal material.

It should be understood that embodiments described herein should be considered in a descriptive sense only and not for purposes of limitation. Descriptions of features or aspects within each embodiment should typically be considered as available for other similar features or aspects in other embodiments. While some embodiments have been described with reference to the figures, it will be understood by those of ordinary skill in the art that various changes in form and details may be made therein without departing from the spirit and scope as defined by the following claims, and equivalents thereof.

What is claimed is:

1. A display device comprising:
   a display panel comprising a foldable area folded based on an axis extending in a first direction, and a first non-foldable area and a second non-foldable area spaced apart from each other in a second direction crossing the first direction with the foldable area being therebetween; and a support plate below the display panel, and comprising:
   a porous metal layer comprising a porous metal material and overlapping the foldable area, the first non-foldable area, and the second non-foldable area;
   an upper support layer on the porous metal layer, having a different density from the porous metal layer, and overlapping the foldable area, the first non-foldable area, and the second non-foldable area; and
   a lower support layer below the porous metal layer, having a different density from the porous metal layer, and overlapping the foldable area, the first non-foldable area, and the second non-foldable area.

2. The display device of claim 1, further comprising an encapsulation material surrounding an edge of the support plate.

3. The display device of claim 2, wherein the encapsulation material surrounds an edge of the porous metal layer.

4. The display device of claim 2, wherein the encapsulation material comprises a conductive spacer comprising a conductive material.

5. The display device of claim 1, wherein the porous metal layer comprises at least one of porous aluminum, porous titanium, or porous copper.

6. The display device of claim 1, wherein the upper support layer comprises an opaque material.

7. The display device of claim 1, wherein the upper support layer comprises at least one of steel use stainless (SUS), titanium (Ti), Ti alloy, aluminum (Al), Al alloy, copper (Cu), Cu alloy, carbon fiber reinforced polymer (CFRP), or glass fiber reinforced polymer (GFRP).

8. A display device comprising:
   a display panel comprising a foldable area folded based on an axis extending in a first direction, and a first non-foldable area and a second non-foldable area spaced apart from each other in a second direction crossing the first direction with the foldable area being therebetween;
   a support plate below the display panel, and comprising:
      a porous metal layer comprising a porous metal material;
      an upper support layer on the porous metal layer and having a different density from the porous metal layer; and
   a lower support layer below the porous metal layer and having a different density from the porous metal layer,
   wherein a width of the porous metal layer in the second direction is smaller than a width of the upper support layer in the second direction and a width of the lower support layer in the second direction.

9. The display device of claim 8, further comprising an encapsulation material surrounding an edge of the support plate.

10. The display device of claim 9, wherein the encapsulation material comprises a portion protruding in a direction facing the porous metal layer.

11. A display device comprising:
   a display panel comprising a foldable area folded based on an axis extending in a first direction, and a first non-foldable area and a second non-foldable area spaced apart from each other in a second direction crossing the first direction with the foldable area therebetween; and a support plate below the display panel, and comprising:

a porous metal layer overlapping the foldable area and comprising a porous metal material; and a support layer surrounding at least a side surface of the porous metal layer and overlapping the porous metal layer in a third direction perpendicular to the first direction and the second direction.

12. The display device of claim 11, wherein the support layer of the support plate comprises a recess portion having a concave shape in a direction opposite to the display panel, in an area overlapping the foldable area.

13. The display device of claim 12, wherein the porous metal layer is on the recess portion of the support layer.

14. The display device of claim 13, wherein the support layer surrounds a side surface and a bottom surface of the porous metal layer.

15. The display device of claim 11, wherein a top surface of the porous metal layer and a top surface of the support layer are on a same plane.

16. The display device of claim 11, wherein the support layer of the support plate comprises a first support layer and a second support layer spaced apart from each other in the second direction.

17. The display device of claim 16, wherein the porous metal layer is on the first support layer and the second support layer.

18. The display device of claim 17, wherein a top surface of the first support layer, a top surface of the second support layer, and a top surface of the porous metal layer are on a same plane.

19. The display device of claim 11, wherein the porous metal layer comprises at least one of porous aluminum, porous titanium, or porous copper.

20. The display device of claim 11, wherein the support layer comprises at least one of steel use stainless (SUS), titanium (Ti), Ti alloy, aluminum (Al), Al alloy, copper (Cu), Cu alloy, carbon fiber reinforced polymer (CFRP), or glass fiber reinforced polymer (GFRP).

\* \* \* \* \*